United States Patent
Kakino et al.

(10) Patent No.: US 7,179,582 B2
(45) Date of Patent: Feb. 20, 2007

(54) RADICAL POLYMERIZABLE COMPOSITION AND LITHOGRAPHIC PRINTING PLATE PRECURSOR USING THE SAME

(75) Inventors: Ryuki Kakino, Shizuoka (JP); Kazuto Kunita, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/900,169

(22) Filed: Jul. 28, 2004

(65) Prior Publication Data
US 2005/0031986 A1    Feb. 10, 2005

(30) Foreign Application Priority Data
Jul. 28, 2003    (JP)    ............ P.2003-202332

(51) Int. Cl.
G03C 1/73    (2006.01)
G03C 1/76    (2006.01)
G03F 7/028    (2006.01)
G03F 7/032    (2006.01)
G03F 7/038    (2006.01)
G03F 7/20    (2006.01)

(52) U.S. Cl. ............... 430/287.1; 430/285.1; 430/325; 430/271.1; 430/302; 430/916; 430/921; 430/925; 430/944

(58) Field of Classification Search ............ 430/281.1, 430/283.1, 285.1, 286.1, 287.1, 916, 944, 430/905, 271.1, 302
See application file for complete search history.

(56) References Cited

U.S. PATENT DOCUMENTS

| 2,850,445 | A |   | 9/1958 | Oster |
| 4,708,925 | A |   | 11/1987 | Newman |
| 2003/0008239 | A1 | * | 1/2003 | Fujimaki et al. ......... 430/281.1 |
| 2004/0009426 | A1 | * | 1/2004 | Goto et al. ............. 430/270.1 |

FOREIGN PATENT DOCUMENTS

| EP | 1 341 040 A1 | * | 9/2003 |
| JP | 44-20189 |   | 8/1969 |
| JP | 8-276558 A |   | 10/1996 |
| JP | 2000-187322 A |   | 7/2000 |

* cited by examiner

*Primary Examiner*—Sin Lee
(74) *Attorney, Agent, or Firm*—Sughrue Mion, PLLC

(57) ABSTRACT

A radical polymerizable composition comprising (A) an alkali-soluble resin containing a radical polymerizable group, (B) a radical polymerizable compound, and (C) a radical initiator, wherein reactivity of a polymerizable group of the polymerizable compound 4B) to a polymerizable group of the polymerizable compound (B) is larger than reactivity of a polymerizable group of the polymerizable compound (B) to a radical polymerizable group of the alkali-soluble resin (A), and a reactivity of a radical polymerizable group of the alkali-soluble resin (A) to a polymerizable group of the polymerizable compound (B) is larger than reactivity of a radical polymerizable group of the alkali-soluble resin (A) to a radical polymerizable group of the alkali-soluble resin (A).

8 Claims, No Drawings

RADICAL POLYMERIZABLE COMPOSITION AND LITHOGRAPHIC PRINTING PLATE PRECURSOR USING THE SAME

FIELD OF THE INVENTION

The present invention relates to a radical polymerizable composition capable of applying to three-dimensional photomolding, holography, a recording layer for lithographic printing plate precursor, a color proof, a photoresist and a color filter. More particularly, it relates to a rad9ical polymerizable composition suitably used as a recording material of a so-called direct plate-making lithographic printing plate precursor, from which a printing plate is directly prepared based on digital signal, for example, from a computer using various kinds of lasers, and a lithographic printing plate precursor using the same.

BACKGROUND OF THE INVENTION

A solid laser, semiconductor laser and gas laser having a large output and a small size, which radiate an ultraviolet ray, visible light or infrared ray having a wavelength of from 300 to 1,200 nm, have become easily available, and these lasers are very advantageous for a recording light source used in the direct plate-making based on digital signal, for example, from a computer.

Various investigations on recording materials sensitive to such laser beams have been made. Representative examples of the recording material include first positive working recording materials capable of being recorded with an infrared laser having a wavelength of not shorter than 760 nm (as described, for example, in Patent Document 1) and negative working recording materials of acid catalyst crosslinking type (as described, for example, in Patent Document 2), and second recording materials responsive to an ultraviolet ray or visible light laser having a wavelength of from 300 to 700 nm, for example, negative working recording materials of radical polymerization type (as described, for example, in Patent Documents 3 and 4).

On the other hand, polymerizable compositions curable with light having a short wavelength of not longer than 300 nm or an electron beam are especially important for photoresist materials. In recent years, the degree of integration is more and more increased in integrated circuits, and the fabrication of ultra-fine patterns composed of lines having a width of finer than a half micron has been required in the production of semiconductor substrate, for example, VLSI. In order to fulfill such requirements, the wavelength of light source for an exposure apparatus used in photolithography is more and more shortened and the use of a far ultraviolet ray or an excimer laser beam (e.g., XeCl, KrF or ArF) has been investigated. Further, the formation of ultra-fine patterns by an electron beam has been started to investigate. Particularly, the electron beam is regarded as a promising light source for the next generation pattern formation techniques.

A problem common to all of these image-forming materials is that how a balance between film strength and preservation stability of a photosensitive layer can be achieved. In particular, it is required for a recording material as a lithographic printing plate precursor to have large film strength in view of printing durability. However, it is a difficult problem to be resolved that both the film strength and the preservation stability of a photosensitive layer are improved at the same time, and a sufficiently satisfactory result cannot be obtained by conventional techniques. Thus, a novel technique different from conventional techniques has been requested.

In order to resolve the problem, a technique of introducing a polymerizable group into an alkali-soluble resin (as described, for example, in Paten Document 5) has beep proposed. In the technique, however, a difference between reactivity of the polymerizable group introduced into the alkali-soluble resin and reactivity of a polymerizable group of the polymerizable compound is small. Therefore, an effect of increase in reaction rate of the polymerizable group is not sufficiently obtained under present circumstances because of less mobility and poor reactivity of polymerizable group radical present in the resin, although reactions between the polymerizable groups introduced into the resin frequently occur.

Patent Document 1: U.S. Pat. No. 4,708,925
Patent Document 2: JP-A-8-276558 (the term "JP-A" as used herein means an "unexamined published Japanese patent application")
Patent Document 3: U.S. Pat. No. 2,850,445
Patent Document 4: JP-B-44-20189 (the term "JP-B" as used herein means an "examined Japanese patent publication")
Patent Document 5: JP-A-2000-187322

SUMMARY OF THE INVENTION

Taking the above problems into consideration, an object of the present invention is to provide a polymerizable composition satisfying both film strength and preservation stability, among radical polymerizable compositions that are promising in image forming techniques due to the highest sensitivity. Another object of the invention is to provide a polymerizable composition suitable for a recording layer of a lithographic printing plate precursor capable of performing direct plate-making based on digital data, for example, from a computer, by recording using a solid laser or semiconductor laser radiating an ultraviolet ray, visible light or infrared ray, and to provide a lithographic printing plate precursor excellent in both film strength and preservation stability using the polymerizable composition as a recording layer.

Other objects of the invention will become apparent from the following description.

As a result of the intensive investigations, it has been found that the above objects can be achieved by using in combination crosslinking functional groups having polymerization property of carbon-carbon double bond in a polymerizable compound contained in a polymerizable composition extremely faster than polymerization property of carbon-carbon double bond in a binder contained in the polymerizable composition.

The invention includes the following items:

(1) A radical polymerizable composition comprising (A) an alkali-soluble resin containing a radical polymerizable group, (B) a radical polymerizable compound, and (C) a radical initiator, wherein reactivity of a polymerizable group of the polymerizable compound (B) to a polymerizable group of the polymerizable compound (B) is larger than reactivity of a polymerizable group of the polymerizable compound (B) to a radical polymerizable group of the alkali-soluble resin (A), and a reactivity of a radical polymerizable group of the alkali-soluble resin (A) to a polymerizable group of the polymerizable compound (B) is larger than reactivity of a radical polymerizable group of the alkali-soluble resin (A) to a radical polymerizable group of the alkali-soluble resin (A).

(2) A lithographic printing plate precursor comprising a support having thereon a recording layer comprising a radical polymerizable composition comprising (A) an alkali-soluble resin containing a radical polymerizable group, (B) a polymerizable compound, and (C) a radical initiator, wherein reactivity between the polymerizable compounds (B) is larger than reactivity between the polymerizable compound (B) and the alkali-soluble resin (A) containing a radical polymerizable group, and the reactivity between the radical polymerizable composition comprising (A) an alkali-soluble resin containing a radical polymerizable group, (B) a radical polymerizable compound, and (C) a radical initiator, wherein reactivity of a polymerizable group of the polymerizable compound (B) to a polymerizable group of the polymerizable compound (B) is larger than reactivity of a polymerizable group of the polymerizable compound (B) to a radical polymerizable group of the alkali-soluble resin (A), and a reactivity of a radical polymerizable group of the alkali-soluble resin (A) to a polymerizable group of the polymerizable compound (B) is larger than reactivity of a radical polymerizable group of the alkali-soluble resin (A) to a radical polymerizable group of the alkali-soluble resin (A).

(3) An image-forming method comprising irradiating the radical polymerizable composition as described in item (1) with a semiconductor laser having a wavelength of from 350 to 1,200 nm.

DETAILED DESCRIPTION OF THE INVENTION

The polymerizable composition of the invention comprises (A) an alkali-soluble resin containing a radical polymerizable group, (B) a radical polymerizable compound, and (C) a radical initiator, wherein reactivity between the polymerizable compounds (B) is larger than reactivity between the polymerizable compound (B) and the alkali-soluble resin (A) containing a radical polymerizable group, and the reactivity between the polymerizable compound (B) and the alkali-soluble resin (A) containing a radical polymerizable group is larger than reactivity between the alkali-soluble resins (A) containing a radical polymerizable group.

The polymerizable composition preferably further contains (D) a sensitizing dye in view of sensitivity.

Although the mechanism according to the invention is not clear in detail, it is believed that in the polymerizable composition of the invention, since a polymerization reaction of the polymerizable compounds proceeds preferentially in the exposed area, decrease in radical mobility accompanied with increase in molecular weight of the polymerizable compound in the course of polymerization does not occur and a reaction rate of a crosslinking group increases. It is also believed that an amount of low-molecular compound causing deterioration of film property of a hardened film formed by the polymerization selectively deceases by selecting of the combination of functional groups so that excellent film property is achieved and deterioration of the film property with the lapse of time due to influence of the remaining low-molecular compound can be prevented.

The lithographic printing plate precursor in accordance with the invention is comprises a support having thereon a recording layer comprising a radical polymerizable composition comprising (A) an alkali-soluble resin containing a radical polymerizable group, (B) a radical polymerizable compound, and (C) a radical initiator, wherein reactivity between the polymerizable compounds (B) is larger than reactivity between the polymerizable compound (B) and the alkali-soluble resin (A) containing a radical polymerizable group, and the reactivity between the polymerizable compound (B) and the alkali-soluble resin (A) containing a radical polymerizable group is larger than reactivity between the alkali-soluble resins (A) containing a radical polymerizable group.

In the lithographic printing plate precursor, since the recording layer contains as the main component, the radical polymerizable composition of the invention, the recording layer having high crosslinking density and a reduced amount of the remaining low-molecular compound is obtained and the amount of the remaining low-molecular compound that accelerates penetration of a developing solution is selectively reduced to improve a rate of prevention from the penetration of a developing solution in the exposed area. Therefore, it is believed that the excellent printing durability and preservation stability can be achieved because good film strength is obtained after the development and deterioration of the film property with the lapse of time due to influence of the remaining low-molecular compound can be prevented.

The radical polymerizable composition of the present invention will be described in detail below.

The radical polymerizable composition of the invention comprises (A) an alkali-soluble resin containing a radical polymerizable group (hereinafter also referred to as a polymerizable alkali-soluble resin, sometimes), (B) a radical polymerizable compound, and (C) a radical initiator, wherein reactivity between the polymerizable compounds (B) is larger than reactivity between the polymerizable compound (B) and the alkali-soluble resin (A) containing a radical polymerizable group, and the reactivity between the polymerizable compound (B) and the alkali-soluble resin (A) containing a radical polymerizable group is larger than reactivity between the alkali-soluble resins (A) containing a radical polymerizable group.

The reactivity between the compounds mainly depends on reactivity of a polymerizable functional group (hereinafter referred to as a polymerizable group (B)) contained in the polymerizable compound (B) and reactivity of the radical polymerizable group (hereinafter referred to as a polymerizable group (A)) contained in the alkali-soluble resin (A).

As the respective polymerizable groups contained in the polymerizable compound (B) and the alkali-soluble resin (A) included in the polymerizable composition of the invention, known polymerizable groups and crosslinking groups described hereinafter, specifically, functional groups having an addition polymerizable ethylenically unsaturated bond can be used. The known functional groups having an addition polymerizable ethylenically unsaturated bond capable of being introduced into the component of the invention include crosslinking groups, for example, acryl, methacryl, crotonyl, vinyl or cinnamyl group, of monomers described in Kobunshi Gakkai ed., Kobunshi Data Handbook, Kiso-Hen (Polymer Data Handbook, Fundamental Edition), Baifukan (1986), and those selected from these groups can be used.

The combination of polymerizable group (A) with polymerizable group (B) in the compounds used in the invention can be determined in consideration of values of monomer reactivity ratios r1 and r2 described, for example, in Kobunshi Gakkai ed., Kobunshi Data Handbook, Kiso-Hen (Polymer Data Handbook, Fundamental Edition), Baifukan (1986). The value of r1 and r2 described below can be easily obtained according to methods described, for example, in Takayuki otsu, Kaitei Kobunsi Goseino Kagaku (Chemistry of Polymer Synthesis, Revised Edition), Tokyo Kagakudojin (1979).

Specifically, assuming that a polymerizable group radical designated as (M•) of polymerizable compound (B) formed in the system and a polymerizable group radical designated as (B•) of alkali-soluble resin (A) containing a polymerizable group formed in the system are copolymerized, reaction style of the copolymerization are represented by the following four propagation elementary reactions:

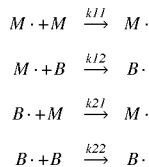

wherein k11 represents a reaction rate of radical addition of a polymerizable group radical of polymerizable compound to a polymerizable group of polymerizable compound, k12 represents a reaction rate of radical addition of the polymerizable group radical of polymerizable compound to a polymerizable group of resin, k22 represents a reaction rate of radical addition of the polymerizable group radical of resin to the polymerizable group of resin, and k21 represents a reaction rate of radical addition of the polymerizable group radical of resin to the polymerizable group of polymerizable compound In the above formulae, defining r1=k11/k12 and r2=k22/k21, a combination of polymerizable group (A) and polymerizable group (B) is so selected that inequalities of r1>1 and r2<1 are satisfied.

With respect to r1, r1>1.2 is preferable, r1>2.0 is more preferable, and r1>2.7 is still more preferable. With respect to r2, r2<0.8 is preferable, r2<0.6 is more preferable, and r2<0.3 is still more preferable. Inequalities of r1>1.2 and r2<0.8 are preferable, r1>2.0 and r2<0.6 are more preferable, and r1>2.7 and r2<0.3 are still more preferable.

A as the combination of polymerizable group (B) in polymerizable compound (B) and polymerizable group (A) in alkali-soluble resin (A) containing the polymerizable group, any combination of polymerizable groups satisfying r1>1 and r2<1 selected from crosslinking groups described in literatures, for example, Kobunshi Gakkai ed., Kobunshi Data Handbook, Kiso-Hen (Polymer Data Handbook, Fundamental Edition), Baifukan (1986) can be used without particular restriction.

Specific examples of the combination of polymerizable groups are set forth below. For example, when a methacrylate group is used as polymerizable group (B) in polymerizable compound (B), a polymerizable group (A) contained in polymerizable alkali-soluble resin (A) to be used in combination includes, for example, an allyl group, an N-vinylacetamido group, an N,N-dialkylacrylamido group, an N-alkylacrylamido group, an N-methylolacrylamido group, an acrylamido group, an α-fluoroacrylamido group, an acryl group, an α-benzylacryl group, an α-acetoxyacryl group, an α-hydroxymethacryl group, an α-phenoxymethylacryl group, an α-tetrafluoropropyloxymethylacryl group, an α-trifluoromethylacryl group, an itaconate group, a maleate group and a maleimido group.

When an acrylate group is used as polymerizable group (B) in polymerizable compound (B), a polymerizable group (A) contained in polymerizable alkali-soluble resin (A) to be used in combination includes, for example, an acrylamido group, an N,N-dialkylvinylcarbamate group, a trichloroethylene group, a maleate group, a vinyl group and a styryl group.

On the other hand, for example, when a styryl group is used as polymerizable group (A) contained in polymerizable alkali-soluble resin (A), a polymerizable group (B) in polymerizable compound (B) to be used in combination includes, for example, an α-phenylacryl group, an α-trimethylsiloxyacryl group, a butadienyl group, a 1-chlorobutadienyl group, a 1-phthalimidobutadienyl group, a 1-succinimidobutadienyl group, a 2,3-dichlorobutadienyl group, a 2,3-dimethylbutadienyl group, 2-chlorobutadienyl group, a 2-fluorobutadienyl group, a 2-trimethylsilyloxybutadienyl group and an isoprenyl group.

When an acrylamido group is used as polymerizable group (A) contained in polymerizable alkali-soluble resin (A), a polymerizable group (B) in polymerizable compound (B) to be used in combination includes, for example, an acryl group, a methacrylate group, a styryl group, a methacrylonitrile group and a 4-vinyl pyridyl group.

Particularly preferred examples of the combination of polymerizable group (B)/polymerizable group (A) include as polymerizable compound (B)/polymerizable alkali-soluble resin (A), acrylate/crotonate, methacrylate/crotonate, acrylate/itaconate, methacrylate/itaconate, acrylate/acrylamide, methacrylate/acrylamide, methacrylate/methacrylamide and methacrylate/styrene. Acrylate/crotonate, acrylate/itaconate, acrylate/acrylamide and methacrylate/crotonate are most preferred.

The criteria for selecting polymerizable groups (A) and (B) suitable for the invention have been described. Each compound preferably used in the polymerizable composition of the invention will be described in turn.

[Polymerizable Compound (B)]

The polymerizable compound (B) suitably used in the invention includes, for example, an ester of an unsaturated carboxylic acid (e.g., acrylic acid, methacrylicacid, itaconic acid, crotonic acid, isocrotonic acid or maleic acid) with an aliphatic polyhydric alcohol compound, and an amide of the above-described unsaturated carboxylic acid with an aliphatic polyvalent amine compound.

Specific examples of monomers, which are the esters of aliphatic polyhydric alcohol compounds with the unsaturated carboxylic acids, include an acrylic acid ester, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri (acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, or a polyester acrylate oligomer.

Specific examples of methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl)dimethylmeth ane, and bis[p-(methacryloxyethoxy)phenyl]dimethylmethane.

The specific examples of itaconic acid ester includes ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Specific examples of crotonic acid ester includes ethylene glycol dicrotonate, tetramethylene glycoldicrotonate, pentaerythritol dicrotonate and sorbitol tetracrotonate.

Specific examples of isocrotonic acid ester includes ethylene glycol diisocrotonate, pentaerythritol diisocrotonate, or sorbitol tetraisocrotonate.

Specific examples of maleic acid ester includes ethylene glycol dimaleate, triethylene glycol dimaleate, pentaerythritol dimaleate and sorbitol tetramaleate. A mixture of the ester monomers is also employed. Specific examples of monomers, which are the amides of aliphatic polyvalent amine compounds with the unsaturated carboxylic acids, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Other examples of the monomers include vinylurethane compounds having at least two polymerizable vinyl groups per molecule obtained by adding a vinyl monomer containing a hydroxyl group represented by formula (A) shown below to a polyisocyanate compound having at least two isocyanate groups in a molecule thereof as described, for example, in JP-B-48-41708.

$$CH_2=C(R)COOCH_2CH(R')OH \quad (A)$$

wherein R and R' each represent H or $CH_3$.

Also, urethane acrylates as described in JP-A-51-37193, polyester acrylates as described in JP-A-48-64183, JP-B-49-43191 and JP-B-52-30490, and polyfunctional acrylates and methacrylates, for example, epoxy acrylates obtained by reacting an epoxy resin with (meth) acrylic acid may be used. Further, photocurable monomers and oligomers as described in *Nippon Secchaku Kyokai-Shi*, Vol. 20, No. 7, pages 300 to 308 (1984) can be used. In the invention, such a monomer may also be used in the chemical form of a prepolymer, for example, a dimer or a trimer, an oligomer, a mixture thereof, or a copolymer thereof.

Structures of polymerizable compounds (B) preferably used in the invention are set forth below as Compounds (B-1) to (B-14), but the invention should not be construed as being limited thereto.

(B-1)

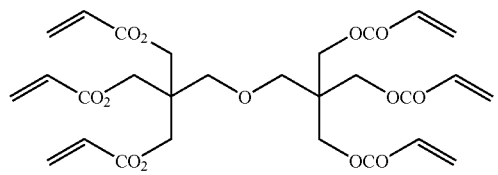

(B-2)

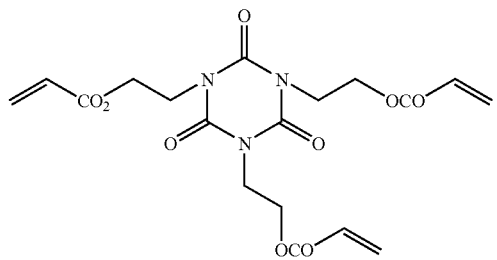

(B-3)

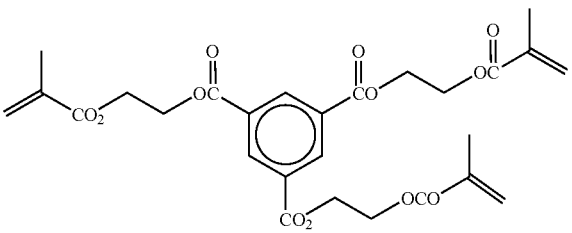

(B-4)

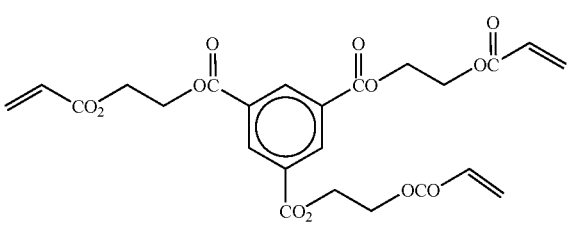

(B-5)

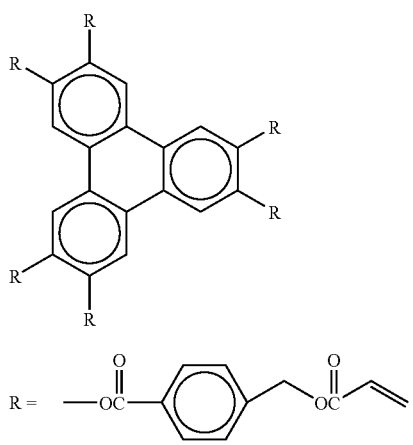

(B-6)

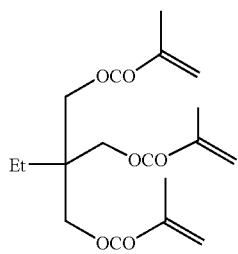

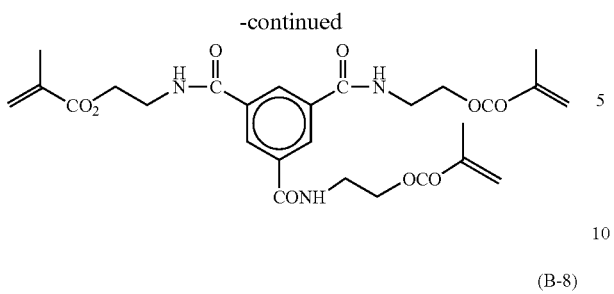
(B-8)

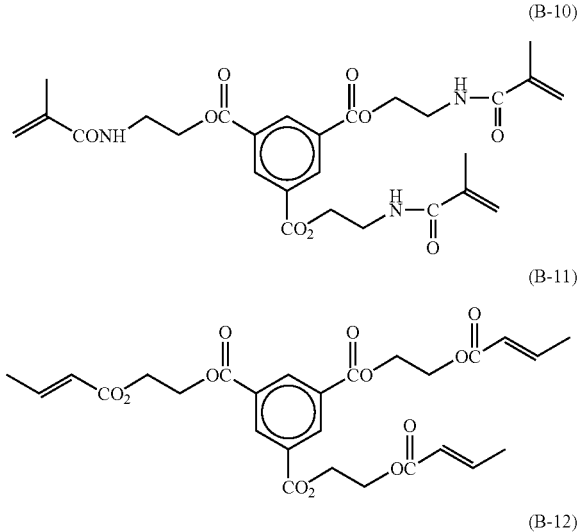
(B-9)
(B-10)
(B-11)
(B-12)

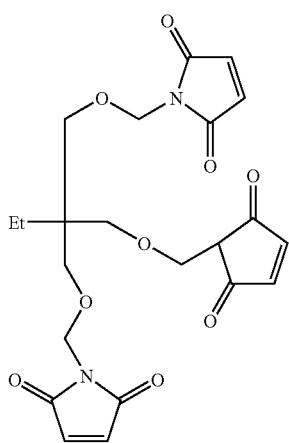

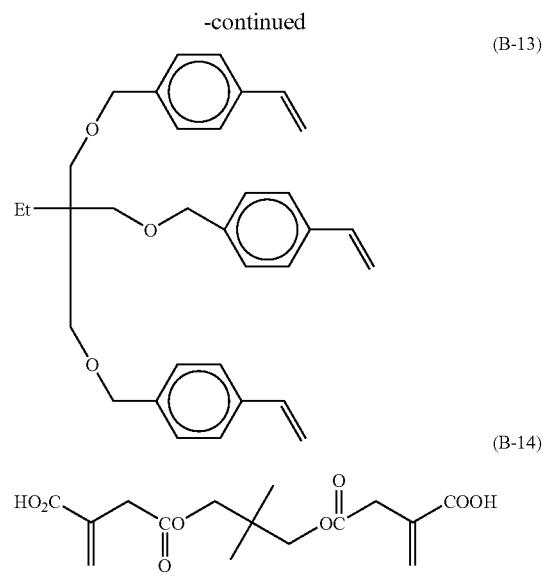
(B-13)
(B-14)

[Alkali-soluble Resin Having Polymerizable Group (A))

The polymerizable alkali-soluble resin (A) according to the invention contains polymerizable group (A) satisfying the above-described condition according to the invention and an alkali-soluble group in the molecule thereof.

Regarding the resin (A), preferred main chain structure, alkali-soluble group capable of being introduced and polymerizable group (A) are described in turn below.

As the resin (A) according to the invention, any specific resin can be used as long as the resin has compatibility with the above-described polymerizable ethylenically unsaturated compound (polymerizable compound (B)) and contains a polymerizable group (A) satisfying the above-described condition.

The main chain structure is not particularly restricted. From the standpoint of the effect, preferred examples of the main chain structure include polyurethane, polyamide, polyester, polyvinyl, polystyrene and poly(meth)acryl. Polystyrene and poly(meth)acryl polymer are more preferred.

It is also required that the specific resin is alkali-soluble. Thus, the resin is a polymer having an acid group in the main chain and/or side chain thereof. The recording layer comprising the polymerizable composition of the invention has a property that the unexposed area, that is, the area before the polymerization curing is dissolved upon contact with an alkaline developing solution.

A content of the radical polymerizable group (content of radical polymerizable unsaturated double bond by iodimetry) in molecule of resin (A) is preferably from 0.1 to 10.0 mmol, more preferably from 1.0 to 7.0 mmol, and most preferably from 2.0 to 6.0 mmol, per g of the resin in view of curing property, sensitivity and preservation stability of the resin.

An acid value of the resin (A) is preferably from 0.01 to 10.00 meq/g, preferably from 0.1 to 7.0 meq/g, and most preferably from 0.2 to 5.0 meq/g. When the acid value of the resin is too high, there is a risk of degrading ink adhesion in case of using the resin as the recording layer of lithographic printing plate precursor.

A weight average molecular weight of the resin (A) according to the invention is appropriately determined from the standpoint of the image-forming property and printing durability. Ordinarily, when the molecular weight increases, the film-forming property and printing durability become excellent, but the image-forming property tends to degrade and becomes hardly soluble in a solvent. On the other hand, when the molecular weight is low, the printing durability tends to degrade although the image-forming property becomes good. Taking these factors into consideration, the molecular weight is preferably from 2,000 to 1,000,000, more preferably from 5,000 to 500,000, and still more preferably from 10,000 to 300,000. In the range, effect of improving the printing durability, the handling property, for example, solubility in a coating solvent or coating property, and the uniform film-forming property can be achieved.

A glass transition point (Tg) of the resin (A) is preferably from 0 to 300° C., more preferably from 20 to 250° C., and most preferably from 50 to 200° C.

The resin (A) used in the invention may be a linear polymer or a branched polymer, or may have a block structure or a graft structure.

Now, preferred embodiments of the alkali-soluble group contained in the polymerizable alkali-soluble resin (A) are described below. The polymerizable alkali-soluble resin (A) according to the invention preferably contains at least one alkali-soluble group selected from the group consisting of groups represented by formulae (1) to (6) shown below in view of solubility in an alkaline developing solution.

(1) a phenolic hydroxy group (—Ar—OH)
(2) a sulfonamido group (—SO$_2$NH—R)
(3) an acid group of a substituted sulfonamido type (hereinafter also referred to as an "active imido group") (—SO$_2$NHCOR, —SO$_2$NHSO$_2$R or —CONHSO$_2$R)
(4) a carboxylic acid group (—CO$_2$H)
(5) a sulfonic acid group (—SO$_3$H)
(6) a phosphoric acid group (—OPO$_3$H$_2$)

In the groups (1) to (6) described above, Ar represents a divalent aryl connecting group, which may have a substituent, and R represents a hydrogen atom or a hydrocarbon group, which may have a substituent.

Of structural units containing the alkali-soluble group selected from (1) to (6) described above, structural units having a phenolic hydroxy group (1), a sulfonamido group (2) or a carboxylic acid group (4) are preferred. In particular, a specific block polymer comprising a structural unit containing as the alkali-soluble group, a carboxylic acid group (4) and other structural unit are most preferred from the standpoint of sufficiently ensuring solubility or swellability and printing durability.

The structural unit containing the alkali-soluble group selected from (1) to (6) described above include, for example, those described below.

The alkali-soluble structural unit having a phenolic hydroxy group (1) includes a structural unit having a hydroxyaryl group in the side chain.

Examples of the structural unit having a hydroxyaryl group in the side chain include structural unit containing any one of the structural units represented by the following formulae (a) to (d):

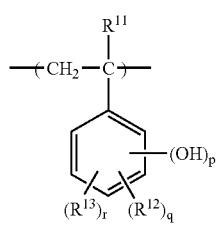

(a)

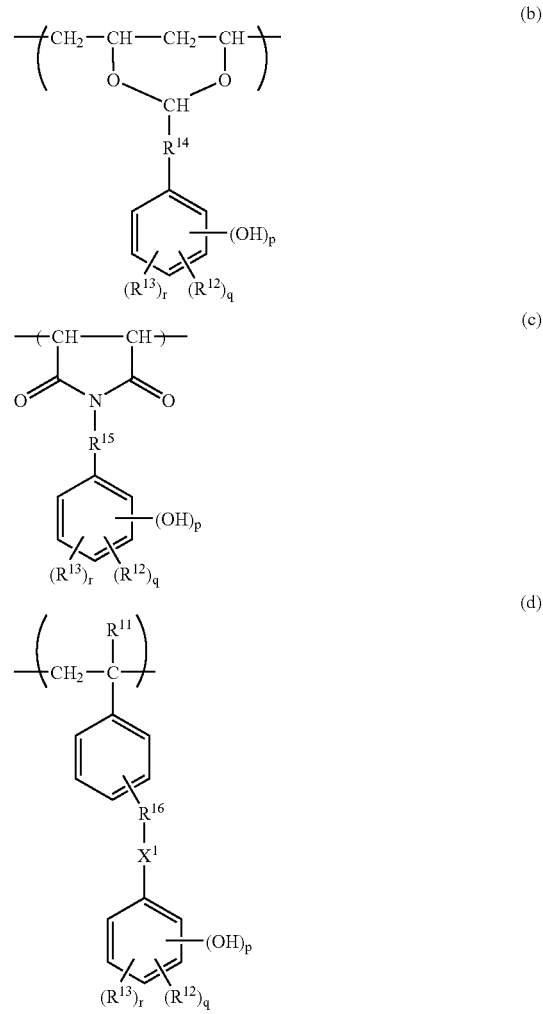

In formulae (a) to (d), $R^{11}$ represents a hydrogen atom or a methyl group. $R^{12}$ and $R^{13}$, which maybe the same or different, each represent a hydrogen atom, a halogen atom, a hydrocarbon group having not more than 10 carbon atoms, an alkoxy group having not more than 10 carbon atoms or an aryloxy group having not more than 10 carbon atoms. Alternatively, $R^{12}$ and $R^{13}$ may be combined with each other to form a condensed ring, for example, a benzene ring or a cyclohexane ring. $R^{14}$ represents a single bond or a divalent hydrocarbon group having not more than 20 carbon atoms. $R^{15}$ represents a single bond or a divalent hydrocarbon group having not more than 20 carbon atoms. $R^{16}$ represents a single bond or a divalent hydrocarbon group having not more than 10 carbon atoms. $X^1$ represents a single bond, an ether bond, a thioether bond, an ester bond or an amido bond. p represents an integer of from 1 to 4. q and r each independently represent an integer of from 0 to 3.

The alkali-soluble structural unit having a sulfonamido group (2) includes, for example, a minimum structural unit derived from a compound having a sulfonamido group. Examples of the structural unit having a sulfonamido group include a structural unit having at least one sulfonamido group wherein at least one hydrogen atom is bonded to the nitrogen atom and at least one polymerizable unsaturated group. Among them, structural units having both an acryloyl group, an allyl group or a vinyloxy group and a substituted or unsubstituted aminosulfonyl group or a substituted sulfonylimino group are preferred. Examples of such structural units include those derived from compounds represented by the following formulae (i) to (v)

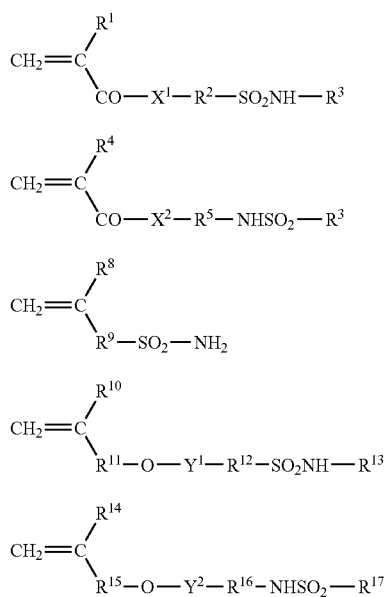

In formulae (i) to (v), $X^1$ and $X^2$ each independently represent —O— or —$NR^7$—. $R^1$ and $R^4$ each independently represent a hydrogen atom or —$C_3$. $R^2$, $R^5$, $R^9$, $R^{12}$ and $R^{16}$ each independently represent an alkylene group having from 1 to 12 carbon atoms, a cycloalkylene group, an arylene group or an aralkylene group, each of which may have a substituent. $R^3$, $R^7$ and $R^{13}$ each independently represent a hydrogen atom or an alkyl group having from 1 to 12 carbon atoms, a cycloalkyl group, an aryl group or an aralkyl group, each of which may have a substituent. $R^6$ and $R^{17}$ each independently represent an alkyl group having from 1 to 12 carbon atoms, a cycloalkyl group, an aryl group or an aralkyl group, each of which may have a substituent. $R^8$, $R^{10}$ and $R^{14}$ each independently represent a hydrogen atom or —$CH_3$. $R^{11}$ and $R^{15}$ each independently represent a single bond or an alkylene group having from 1 to 12 carbon atoms, a cycloalkylene group, an arylene group or an aralkylene group, each of which may have a substituent. $Y^1$ and $Y^2$ each independently represent a single bond or CO.

The alkali-soluble structural unit having an active imido group (3) includes, for example, a minimum structural unit derived from a compound having an active imido group. Examples of the structural unit having an active imido group include a structural unit having at least one active imido group represented by the structure shown below and at least one polymerizable unsaturated group.

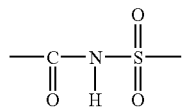

The alkali-soluble structural unit having a carboxylic acid group (4) include a minimum structural unit derived from a compound having at least one carboxylic acid group and at least one polymerizable unsaturated group in the molecule thereof.

The alkali-soluble structural unit having a sulfonic acid group (5) include a minimum structural unit derived from a compound having at least one sulfonic acid group and at least one polymerizable unsaturated group in the molecule thereof.

The alkali-soluble structural unit having a phosphoric acid group (6) include a minimum structural unit derived from a compound having at least one phosphoric acid group and at least one polymerizable unsaturated group in the molecule thereof.

It is not necessary to use only one kind of the minimum structural unit having the acidic group selected from the groups represented by formulae (1) to (6) described above constituting the alkali-soluble polymer for use in the invention, and a copolymer obtained by copolymerization of two or more minimum structural units having the same acidic group or a copolymer obtained by copolymerization of two or more minimum constituting units having different acidic groups may be used. The alkali-soluble resin having a radical polymerizable group for use in the invention may be a linear polymer or a branched polymer or may have a block structure or a graft structure.

The amount of the structural unit having an alkali-soluble group introduced into the polymer is not particularly restricted as far as the polymer can be dissolved in an alkali developing solution having a pH of from 10 to 13.

Preferred embodiments of the alkali-soluble group in the alkali-soluble resin having a radical polymerizable group for use in the invention include a structural unit (repeating unit) represented by the following formula (I):

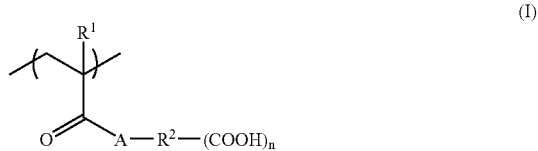

In formula (I), $R^1$ represents a hydrogen atom or a methyl group. $R^2$ represents a connecting group being composed of a carbon atom, a hydrogen atom, an oxygen atom, a nitrogen atom, a sulfur atom and a halogen atom and having the number of atoms of from 2 to 30 excluding that included in a substituent. A represents an oxygen atom or —$NR_3$— wherein $R^3$ represents a hydrogen atom or a monovalent hydrocarbon group having from 1 to 10 carbon atoms. n represents An integer of from 1 to 5.

The unit represented by formula (I) is described in detail below.

$R^1$ in formula (I) represents a hydrogen atom or a methyl group, and a methyl group is particularly preferred.

The connecting group represented by $R^2$ in formula (I) is composed of a carbon atom, a hydrogen atom, an oxygen atom, a nitrogen atom, a sulfur atom and a halogen atom and has the number of atoms included therein excluding that included in the substituent is from 2 to 30. Specific examples of the connecting group include an alkylene group, a substituted alkylene group, an arylene group and a substituted arylene group. The connecting group may have a structure wherein a plurality of such divalent groups is connected with an amido bond or an ester bond.

The connecting group of a chin structure includes, for example, ethylene and propylene. A connecting group formed by bonding such alkylene groups through an ester bond is also preferably used.

The connecting group represented by $R^2$ in formula (I) is more preferably a (n+1) valent hydrocarbon group having an aliphatic cyclic structure or chain structure having from 3 to 30 carbon atoms. Specific examples thereof include a (n+1) valent hydrocarbon group formed by eliminating (n+1) hydrogen atoms on any carbon atom constituting a compound having an aliphatic cyclic structure, for example, cyclopropane, cyclopentane, cyclohexane, cycloheptane, cyclooctane, cyclodecane, dicyclohexyl, tercyclohexyl or norbornane or a compound having an aliphatic chain structure having from 5 to 20 carbon atoms.

Any carbon atom of the compound constituting the aliphatic cyclic structure or chain structure may be substituted with a hetero atom selected from a nitrogen atom, an oxygen atom and a sulfur atom.

The substituent capable of being introduced into the connecting group represented by $R^2$ includes a monovalent non-metallic atomic group exclusive of a hydrogen atom. Specific examples of the substituent include a halogen atom (e.g., fluorine, bromine, chlorine or iodine), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group; an N-arylacylamino group, a ureido group, an N'-alkylureido group, an N',N'-dialkylureido group, N'-arylureido group, an N',N'-diarylureido group, an N'-alkyl-N'-arylureido group, an N-alkylureido group, N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxy group and a conjugate base group thereof, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof, an alkoxysulfonyl group, an aryloxysulfonyl group, a sulfipamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an N-alkylsulfonylsulfamoyl group (—$SO_2NHSO_2$(alkyl)) and a conjugate base group thereof, an N-arylsulfonylsulfamoyl group (—$SO_2NHSO_2$(aryl)) and a conjugate base group thereof, an N-alkylsulfonylcarbamoyl group (—$CONHSO_2$(alkyl)) and a conjugate base group thereof, an N-arylsul-fonylcarbamoyl group (—$CONHSO_2$(aryl)) and a conjugate base group thereof, an alkoxysilyl group (—$Si(O-alkyl)_3$), an aryloxysilyl group (—$Si(O-aryl)_3$), a hydroxysilyl group (—$Si(OH)_3$) and a conjugate base group thereof, a phosphono group (—$PO_3H_2$) and a conjugate base group thereof, a dialkylphosphono group (—$PO_3(alkyl)_2$), a diarylphosphono group (—$PO_3(aryl)_2$), an alkylarylphosphono group (—$PO_3$(alkyl) (aryl)), a monoalkylphosphono group (—$PO_3H$(alkyl)) and a conjugate base group thereof, a monoarylphosphono group (—$PO_3H$(aryl)) and a conjugate base group thereof (hereinafter, referred to as an arylphosphonato group), a phosphonoxy group (—$OPO_3H_2$) and a conjugate base group thereof, a dialkylphosphonoxy group (—$OPO_3$ (alkyl)$_2$), a diarylphosphonoxy group (—$OPO_3$ (aryl)$_2$), an alkylarylphosphonoxy group (—$OPO_3$(alkyl) (aryl)), a monoalkylphosphonoxy group (—$OPO_3H$(alkyl)) and a conjugatebase group thereof (hereinafter, referred to as an alkyiphosphonatoxy group), a monoarylphosphonoxy group (—$OPO_3H$ (aryl)) and a conjugate base group thereof, a cyano group, a nitro group, a dialkylboryl group (—$B$(alkyl)$_2$), a diarylboryl group (—$B$(aryl)$_2$), an alkylarylboryl group (—$B$(alkyl) (aryl)), a dihydroxyboryl group (—$B$(OH)$_2$) and a conjugate base group thereof, an alkylhydroxyboryl group (—$B$(alkyl) (OH)) and a conjugate base group thereof an arylhydroxyboryl group (—$B$(aryl) (OH)) and a conjugate base group thereof, an aryl group, an alkenyl group and an alkynyl group.

Of the substituents described above, a halogen atom and a hydrophobic substituent, for example, a hydrocarbon group (e.g., an alkyl group, an aryl group, an alkenyl group or an alkynyl group), an alkoxy group or an aryloxy group are preferred since such a substituent tends to increase printing durability. In particular, when the cyclic structure is a 6-membered or less monocyclic aliphatic hydrocarbon group, for example, cyclopentane or cyclohexane), it is preferred for the cyclic structure to have such a hydrophobic substituent. The substituents may be combined with each other or the substituent may be combined with the hydrocarbon group to form a ring and the substituent may further be substituted.

In formula (I), A represents an oxygen atom or —$NR^3$—. When A represents —$NR^3$—, $R^3$ represents a hydrogen atom or a monovalent hydrocarbon group having from 1 to 10 carbon atoms. Examples of the monovalent hydrocarbon group having from 1 to 10 carbon atoms include an alkyl group, an aryl group, an alkenyl group and an alkynyl group.

Specific examples of the alkyl group include a straight chain, branched or cyclic alkyl group having from 1 to 10 carbon atoms, for example, methyl, ethyl, propyl, butyl, pentyl, hexyl, heptyl, octyl, nonyl, decyl, isopropyl, isobutyl, sec-butyl, tert-butyl, isopentyl, neopentyl, 1-methylbutyl, isohexyl, 2-ethylhexyl, 2-methylhexyl, cyclopentyl, cyclohexyl, 1-adamantyl or 2-norbornyl group.

Specific examples of the aryl group include an aryl group having from 1 to 10 carbon atoms, for example, phenyl, naphthyl or indenyl group, or a heteroaryl group having from 1 to 10 carbon atoms and containing one or more hetero atoms selected from a nitrogen atom, an oxygen atom and a sulfur atom, for example, furyl, thienyl, pyrolyl, pyridyl or quinolyl group specific examples of the alkenyl group include a straight chain, branched or cyclic alkenyl group having from 2 to 10 carbon atoms, for example, vinyl, 1-propenyl, 1-butenyl, 1-methyl-1-propenyl, 1-cyclopentenyl or 1-cyclohexenyl group.

Specific examples of the alkynyl group include an alkynyl group having from 2 to 10 carbon atoms, for example, ethynyl, 1-propynyl, 1-butynyl or 1-octynyl group.

The substituents, which the hydrocarbon group represented by $R^3$ may have, are same as those capable of being introduced into $R^2$. The number of carbon atoms included in the hydrocarbon group represented by $R^3$ including the number of carbon atoms of the substituent is form 1 to 10.

A in formula (I) is preferably an oxygen atom or —NH— from the standpoint of easiness of the synthesis.

n in formula (I) represents an integer of from 1 to 5, and is preferably 1 in view of printing durability.

Specific examples of the structure of polymerizable alkali-soluble resin (A) (Compounds (A-1) to (A-37)) suitably used in the invention are set forth below together with the weight average molecular weight (indicated as MW) thereof, but the invention should not be construed as being limited thereto.

(A-1)

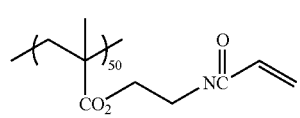

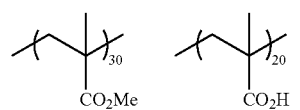

MW: 131,000

(A-2)

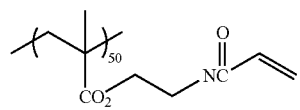

MW: 126,000

(A-3)

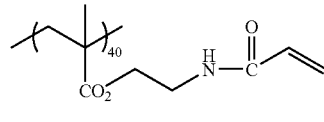

MW: 136,000

(A-4)

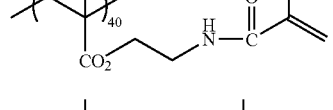

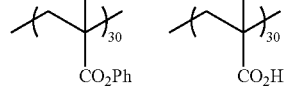

MW: 109,000

(A-5)

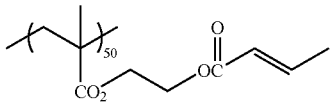

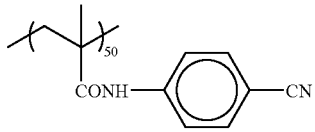

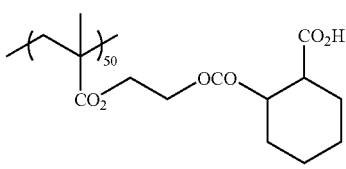

MW: 145,000

(A-6)

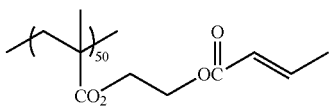 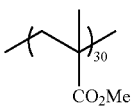

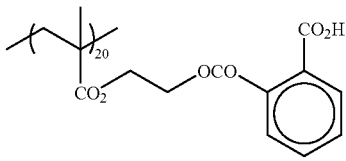

Mw: 122,000

(A-7)

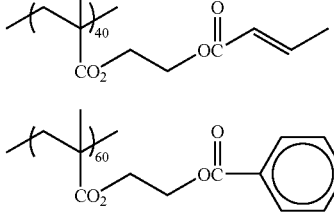

Mw: 99,000

(A-8)

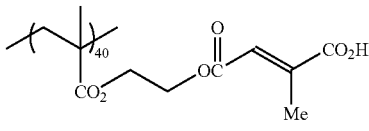

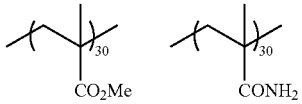

Mw: 133,000

(A-9)

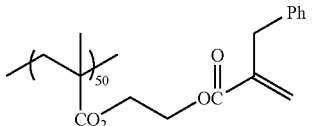

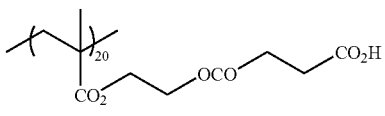

Mw: 121,000

(A-10)
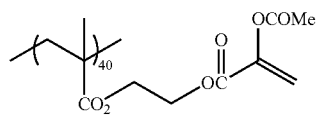
Mw: 150,000
(A-11)
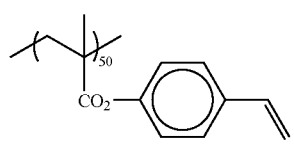
Mw: 103,000
(A-12)
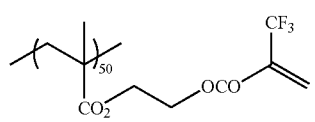
Mw: 125,000
(A-13)
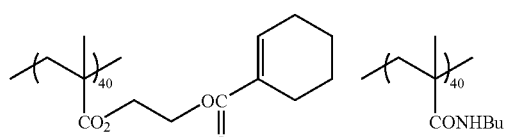
Mw: 140,000
(A-14)
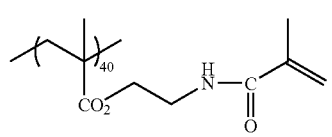
Mw: 121,000
(A-15)
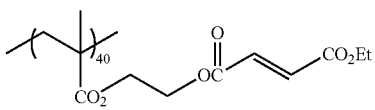
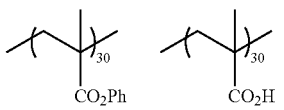
Mw: 132,000
(A-16)
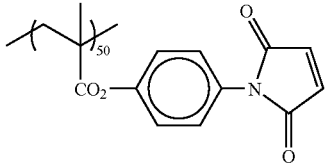
Mw: 109,000
(A-17)
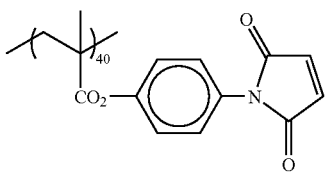
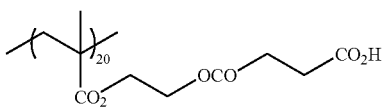
Mw: 132,000
(A-18)
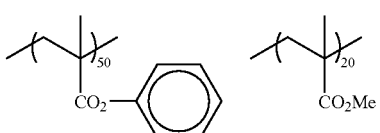
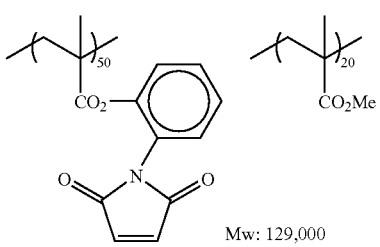
Mw: 129,000
(A-19)
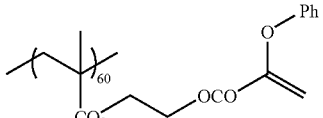
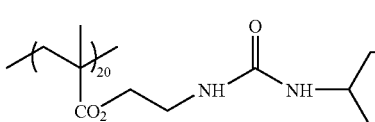
MW: 138,000

-continued
(A-20)
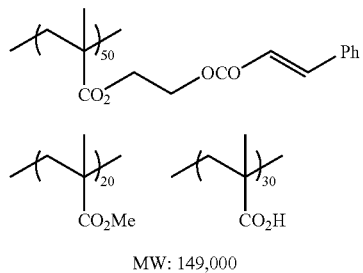
MW: 149,000
(A-21)
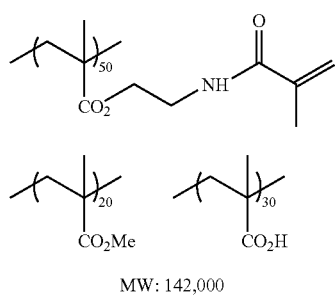
MW: 142,000
(A-22)
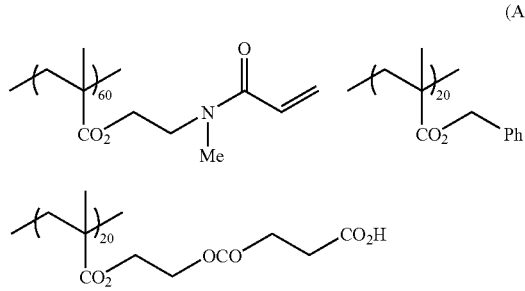
MW: 115,000
(A-23)
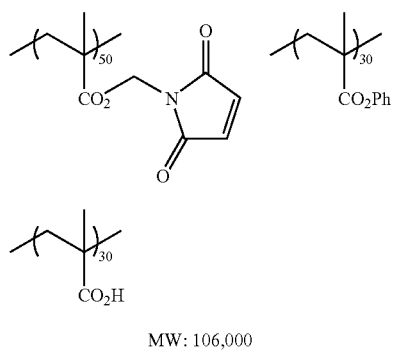
MW: 106,000
(A-24)
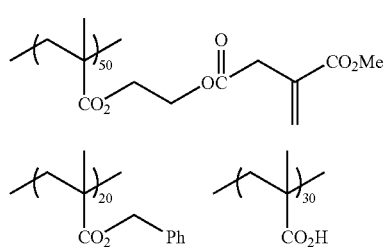
MW: 139,000
-continued
(A-25)
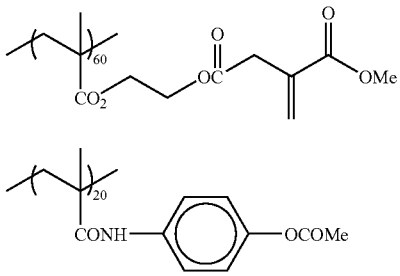
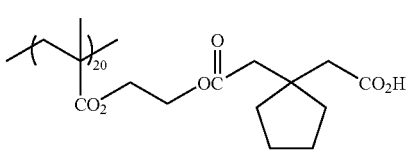
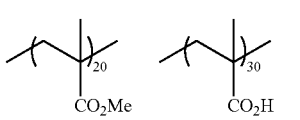
MW: 126,000
(A-26)
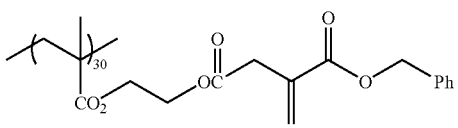
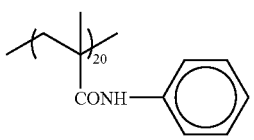
MW: 140,000
(A-27)
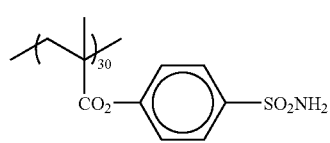
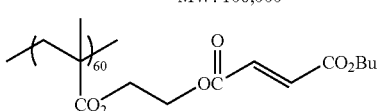
MW: 106,000
(A-28)
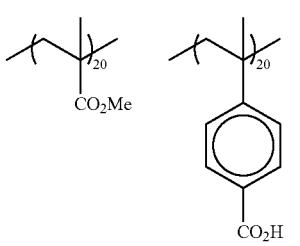
MW: 148,000

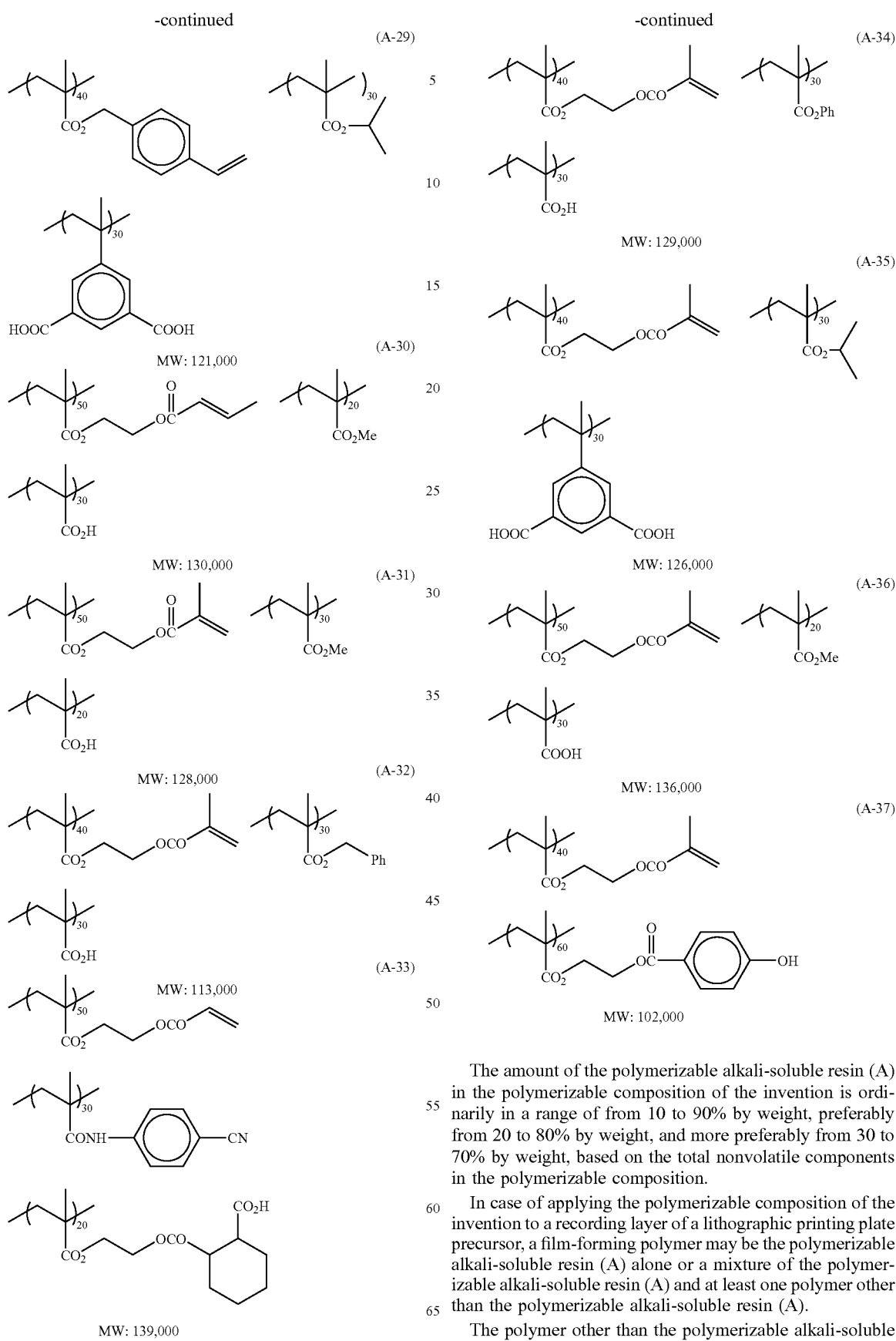

The amount of the polymerizable alkali-soluble resin (A) in the polymerizable composition of the invention is ordinarily in a range of from 10 to 90% by weight, preferably from 20 to 80% by weight, and more preferably from 30 to 70% by weight, based on the total nonvolatile components in the polymerizable composition.

In case of applying the polymerizable composition of the invention to a recording layer of a lithographic printing plate precursor, a film-forming polymer may be the polymerizable alkali-soluble resin (A) alone or a mixture of the polymerizable alkali-soluble resin (A) and at least one polymer other than the polymerizable alkali-soluble resin (A).

The polymer other than the polymerizable alkali-soluble resin (A) capable of being used together with the polymerizable alkali-soluble resin (A) includes known binder polymers. As the binder polymer used together with the polymerizable alkali-soluble resin (A), those conventionally known can be used without any limitation. Specifically, acryl main chain binders and urethane binders, which are often used in the field of art, are preferably used.

The conventional binder polymer used together with the polymerizable alkali-soluble resin (A) is used in a range of from 1 to 60% by weight, preferably from 1 to 40% by weight, and more preferably from 1 to 30% by weight, based on the total amount of the polymerizable alkali-soluble resin (A) and the conventional binder polymer.

The total amount of the polymerizable alkali-soluble resin (A) and the conventional binder polymer used, if desired, in the recording layer of lithographic printing plate precursor can be appropriately determined. It is ordinarily from 10 to 90% by weight, preferably from 20 to 80% by weight, and more preferably from 30 to 70% by weight, based on the total amount of nonvolatile components in the recording layer.

Preferred examples of the combination of specific compounds of polymerizable alkali-soluble resin (A) and polymerizable compound (B) selected by taking the reactivities of polymerization group (A) and polymerization group (B) into consideration are set forth below, but the invention should not be construed as being limited thereto.

Combinations of Polymerizable alkali-soluble resins (A-1), (A-3), (A-7), (A-9) and (A-15) with Polymerizable compound (B-3)

Combinations of Polymerizable alkali-soluble resins (A-2) and (A-5) with Polymerizable compound (B-4)

Combinations of Polymerizable alkali-soluble resins (A-10), (A-14), (A-17), (A-18) and (A-21) with Polymerizable compound (B-6)

[Radical Initiator (C)]

The polymerizable composition of the invention contains the radical initiator (C) (hereinafter also referred to as polymerization initiator).

Preferred examples of the polymerization initiator include (a) an aromatic ketone, (b) an onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, and (k) a compound having a carbon-halogen bond. The onium salt compound and compound having a carbon-halogen bond are preferably used. Specific examples of the compounds of (a) to (k) are set forth below, but the invention should not be construed as being limited thereto.

(a) Aromatic Ketone

The aromatic ketone (a) preferably used as the polymerization initiator in the invention includes compounds having a benzophenone skeleton or a thioxantone skeleton as described in J. P. Fouassier and J. F. Rabek, *Radiation Curing in Polymer Science and Technology,* pages 77 to 117 (1993). For example, the following compounds are recited.

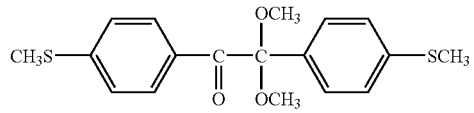

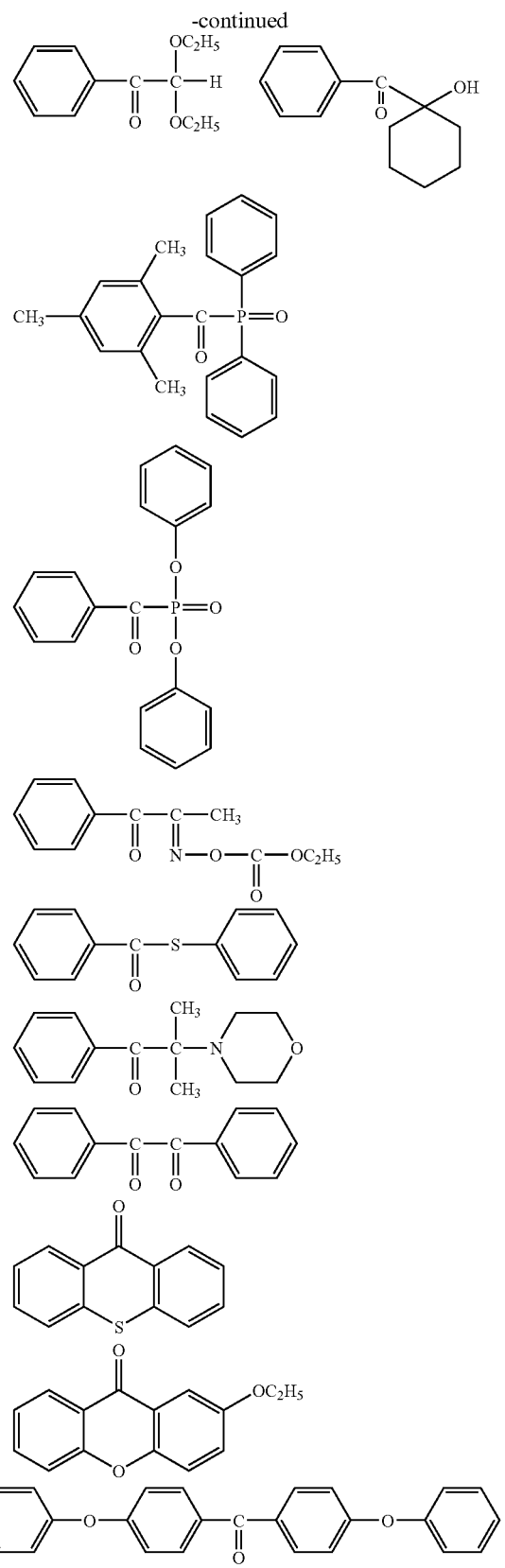

Among them, particularly preferred examples of the aromatic ketone (a) include α-thiobenzophenone compounds as described in JP-B-47-6416, and benzoin ether compounds as described in JP-B-47-3981, specifically, for example, the following compound:

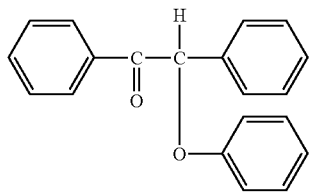

α-substituted benzoin compounds as described in JP-B-47-22326, specifically, for example, the following compound:

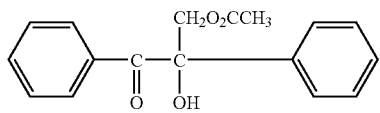

benzoin derivatives as described in JP-B-47-23664, aroylphophonic esters as described in JP-A-57-30704, and dialkoxybenzophenones as described in JP-B-60-26483, specifically, for example, the following compound:

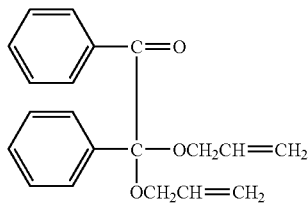

benzoin ethers as described in JP-B-60-26403 and JP-A-62-81345, specifically, for example, the following compound:

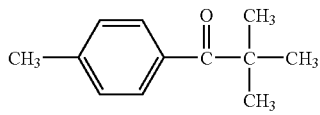

α-aminobenzophenones as described in JP-B-1-34242, U.S. Pat. No. 4,318,791 and EP-A-284,561, specifically, for example, the following, compound:

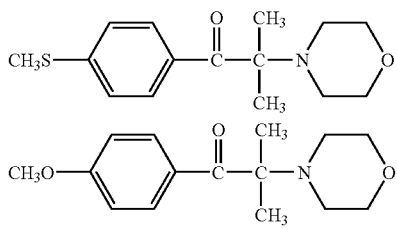

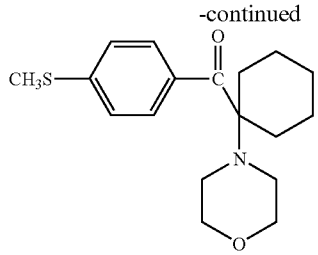

p-di(dimethylaminobenzoyl)benzene as described in JP-A-2-211452, specifically, for example, the following compound:

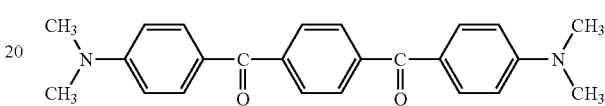

thio-substituted aromatic ketones as described in JP-A-61-194062, specifically, for example, the following compound:

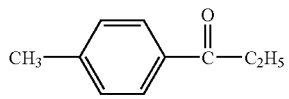

acylphosphinesulfides as described in JP-B-2-9597, specifically, for example, the following compound:

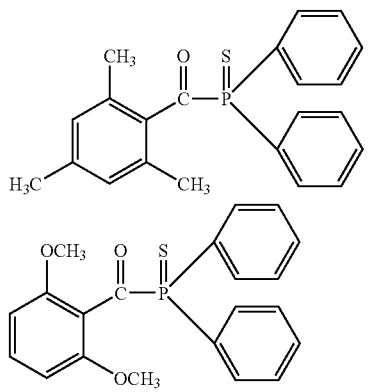

acylphosphines as described in JP-B-2-9596, specifically, for example, the following compound:

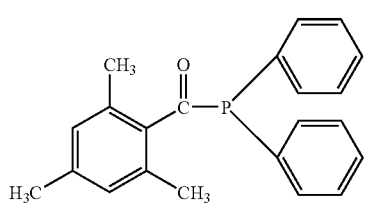

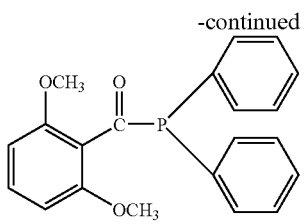

Also, thioxantones as described in JP-2-63-61950, and coumarins as described in JP-B-59-42864 are recited.

(b) Onium Salt Compound

The onium salt compound (b) preferably used as the polymerization initiator in the intention includes compounds represented by the following formulae (1) to (3):

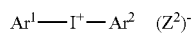  (1)

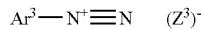  (2)

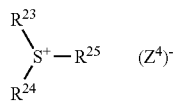  (3)

In formula (1), $Ar^1$ and $Ar^2$ each independently represent an aryl group having not more than 20 carbon atoms, which may have a substituent. When the aryl group has a substituent, preferred example of the substituent include a halogen atom, a nitro group, an alkyl group having not more than 12 carbon atoms, an alkoxy group having not more than 12 carbon atoms and an aryloxy group having not more than 12 carbon atoms. $(Z^2)^-$ represents a counter ion selected from the group consisting of a halogen ion, a perchlorate ion, a tetrafluoroborate ion, a hexafluorophosphate ion and a sulfonate ion, and is preferably a perchlorate ion, a hexafluorophosphate ion and an arylsulfonate ion.

In formula (2), $Ar^3$ represents an aryl group having not more than 20 carbon atoms, which may have a substituent. Preferred example of the substituent include a halogen atom, a nitro group, an alkyl group having not more than 12 carbon atoms, an alkoxy group having hot more than 12 carbon atoms, an aryloxy group having not more than 12 carbon atoms, an alkylamino group having not more than 12 carbon atoms, a dialkylamino group having not more than 12 carbon atoms an arylamino group having not more than 12 carbon atoms or a diarylamino group having not more than 12 carbon atoms. $(Z^3)^-$ represents a counter ion having the same meaning as defined for $(Z^2)^-$.

In formula (3), $R^{23}$, $R^{24}$ and $R^{25}$, which may be the same or different, each independently represent a hudrocarbon group having not more than 20 carbon atoms, which may have a substituent Preferred example of the substituent include a halogen atom, a nitro group, an alkyl group having not more than 12 carbon atoms, an alkoxy group having not more than 12 carbon atoms and an aryloxy group having not more than 12 carbon atoms. $(Z^4)^-$ represents a counter ion having the same meaning as defined for $(Z^2)^-$.

Specific examples of the onium salt preferably used in the invention include those described in JP-A-2001-133969, paragraphs [0030] to [0033], JP-A-2001-92127, paragraphs [0096] to [0101] and JP-A-2001-343742, paragraphs [0015] to [0046].

The onium salt used in the invention has the maximum absorption wavelength preferably not longer than 400 nm, and more preferably not longer than 360 nm. By defining the absorption wavelength in an ultraviolet region as described above, the lithographic printing plate precursor can be handled under white light.

(c) Organic Peroxide Compound

The organic peroxide compound (c) preferably used as the polymerization initiator in the invention includes almost all organic compounds having at least one oxygen-oxygen bond in the molecules thereof. Specific examples of the organic peroxide compound include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-xanoyl peroxide, succinic peroxide, benzoyl peroxide, 2,4-dichlorobenzoyl peroxide, methatoluoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy-3,5,5-trimethyl hexanoate, tert-butylperoxy laurate, tertiary carbonate, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyl di (tert-butylperoxydihydrogen diphthalate) and carbonyl di(tert-hexylperoxydihydrogen diphthalate).

Of the organic peroxide compounds, ester peroxides, for example,
3,3',4,4'-tetra(tert-butylperoxycarbonyl)benzophenone,
3,3',4,4'-tetra(tert-amylperoxycarbonyl)benzophenone,
3,3',4,4'-tetra(tert-hexylperoxycarbonyl)benzophenone,
3,3',4,4'-tetra(tert-octylperoxycarbonyl)benzophenone,
3,3',4,4'-tetra(cumylperoxycarbonyl)benzophenone,
3,3',4,4'-tetra(p-isopropylcumylperoxycarbonyl)-benzophenone and di-tert-butyldiperoxy isophthalate are preferred.

(d) Thio Compound

The thio compound (d) preferably used as the polyerization initiator in the invention includes compounds represented by the following formula (4):

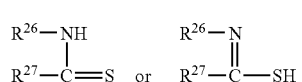  (4)

In formula (4), $R^{26}$ represents an alkyl group, an aryl group or a substituted aryl group. $R^{27}$ represents a hydrogen atom or an alkyl group. Alternatively, $R^{26}$ and $R^{27}$ combine with each other and together represent a non-metallic atomic group necessary for forming a 5-membered, 6-membered or 7-membered ring, which may contain a hetero atom selected from an oxygen atom, a sulfur atom and a nitrogen atom.

The alkyl group in formula (4) is preferably that having from 1 to 4 carbon atoms. The aryl group in formula (4) is preferably that having from 6 to 10 carbon atoms, for example, phenyl or naphthyl group. The substituted aryl group includes the above-described aryl group substituted with, for example, a halogen atom, e.g., chlorine atom, and an alkyl group, e.g., methyl group, or an alkoxy group, e.g., methoxy or ethoxy group. $R^{27}$ preferably represents an alkyl group having from 1 to 4 carbon atoms. Specific examples of the thio compound represented by formula (4) include the following compounds:

| No. | $R^{26}$ | $R^{27}$ |
|---|---|---|
| 1 | —H | —H |
| 2 | —H | —CH$_3$ |
| 3 | —CH$_3$ | —H |
| 4 | —CH$_3$ | —CH$_3$ |
| 5 | —C$_6$H$_5$ | —C$_2$H$_5$ |
| 6 | —C$_6$H$_5$ | —C$_4$H$_9$ |
| 7 | —C$_6$H$_4$Cl | —CH$_3$ |
| 8 | —C$_6$H$_4$Cl | —C$_4$H$_5$ |
| 9 | —C$_6$H$_4$—CH$_3$ | —C$_4$H$_5$ |
| 10 | —C$_6$H$_4$—OCH$_3$ | —CH$_3$ |
| 11 | —C$_6$H$_4$—OCH$_3$ | —C$_2$H$_9$ |
| 12 | —C$_6$H$_4$—OC$_2$H$_5$ | —CH$_3$ |
| 13 | —C$_6$H$_4$—OC$_2$H$_5$ | —C$_2$H$_5$ |
| 14 | —C$_6$H$_4$—OCH$_3$ | —C$_4$H$_9$ |
| 15 | | —(CH$_2$)$_2$— |
| 16 | | —(CH$_2$)$_2$—S— |
| 17 | | —CH(CH$_3$)—CH$_2$—S— |
| 18 | | —CH$_2$—CH(CH$_3$)—S— |
| 19 | | —C(CH$_3$)$_2$—CH$_2$—S— |
| 20 | | —CH$_2$—C(CH$_3$)$_2$—S— |
| 21 | | —(CH$_2$)$_2$—O— |
| 22 | | —CH(CH$_3$)—CH$_2$—O— |
| 23 | | —C(CH$_3$)$_2$—CH$_2$—O— |
| 24 | | —CH=CH—N(CH$_3$)— |
| 25 | | —(CH$_2$)$_3$—S— |
| 26 | | —(CH$_2$)$_2$—CH(CH$_3$)—S— |
| 27 | | —(CH$_2$)$_3$—O— |
| 28 | | —(CH$_2$)$_5$— |
| 29 | | —C$_6$H$_4$—O— |
| 30 | | —N=C(SCH$_3$)—S— |
| 31 | | —C$_6$H$_4$—NH— |
| 32 | 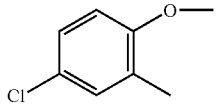 | |

(e) Hexaarylbiimidazole Compound

The hexaarylbiimidazole compound (e) preferably used as the polymerization initiator in the invention includes lophine dimers as described in JP-B-45-37377 and JP-B-44-86516, specifically, for example, 2,2'-bis o-chlorophenyl)-4,4',5,5'-tetraphenylbiimidazole,
2,2'-bis(o-bromophenyl)-4,4',5,5'-tetraphenylbiimidazole,
2,2'-bis (o,p-dichlorophenyl)-4,4',5,5'-tetraphenylbiimidazole,
2,2'-bis(o-chlorophenyl)-4,4',5,5'-tetra(m-methoxyphenyl) biimidazole,
2,2'-bis(o,o'-dichlorophenyl)-4,4',5,5'-tetraphenylbiimidazole,
2,2'-bis(o-nitrophenyl)-4(4',5,5'-tetraphenylbiimidazole,
2,2'-bis(o-methylphenyl)-4,4',5,5'-tetraphenylbiimidazole and 2,2'-bis(o-trifluoromethylphenyl)-4,4',5,5'-tetraphenylbiimidazole.

(f) Ketoxime Ester Compound

The ketoxime ester compound (f) preferably used as the polymerization initiator in the invention includes, for example, 3-benzoyloxyiminobutan-2-one, 3-acetoxyiminobutan-2-one, 3-propyonyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

(g) Borate Compound

The borate compound (g) preferably used as the polymerization initiator in the invention includes compounds represented by the following formula (5):

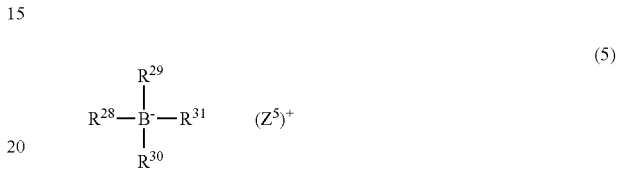

In formula (5), $R^{28}$, $R^{29}$, $R^{30}$ and $R^{31}$, which may be the same or different, each represent a substituted or unsubstituted alkyl group, a substituted or unsubstituted aryl group, a substituted or unsubstituted alkenyl group, a substituted or unsubstituted alkynyl group or a substituted or unsubstituted heterocyclic group, or at least two of $R^{28}$, $R^{29}$, $R^{30}$ and $R^{31}$ may be combined with each other to form a cyclic structure, provided that at least one of $R^{28}$, $R^{29}$, $R^{30}$ and $R^{31}$ represents a substituted or unsubstituted alkyl group. $(Z^5)^+$ represents an alkali metal cation or a quaternary ammonium cation.

The alkyl group represented by any one of $R^{28}$ to $R^{31}$ includes a straight chain, branched or cyclic alkyl group, and preferably has from 1 to 18 carbon atoms. Specific examples thereof include methyl, ethyl, propyl, isopropyl, butyl, pentyl, hexyl, octyl, stearyl, cyclobutyl, cyclopentyl and cyclohexyl groups. The substituted alkyl group represented by any one of $R^{28}$ to $R^{31}$ includes the above-described alkyl group substituted with a halogen atom (e.g., chlorine or bromine atom), a cyano group, a nitro group, an aryl group (e.g., phenyl group), a hydroxy group, —COOR$^{32}$ (wherein $R^{32}$ represents a hydrogen atom, an alkyl group having from 1 to 14 carbon atoms or an aryl group) —OCOR$^{33}$ (wherein $R^{33}$ represents an alkyl group having from 1 to 14 carbon atoms or an aryl group), —OR$^{34}$ (wherein $R^{34}$ represents an alkyl group having from 1 to 14 carbon atoms or an aryl group) or a group represented by the following formula:

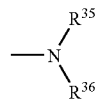

wherein $R^{35}$ and $R^{36}$ each represents a hydrogen atom, an alkyl group having from 1 to 14 carbon atoms or an aryl group.

The aryl group represented by any one of $R^{28}$ to $R^{31}$ includes an aryl group having from one to three rings, for example, phenyl or naphthyl group. The substituted aryl group represented by any one of $R^{28}$ to $R^{31}$ includes the above-described aryl group substituted with the substituent described for the substituted alkyl group above or an alkyl group having from 1 to 14 carbon atoms. The alkenyl group represented by any one of $R^{28}$ to $R^{31}$ includes a straight chain, branched or cyclic alkenyl group having from 2 to 18 carbon atoms. In the substituted alkenyl group, the substituent includes the substituents described for the substituted alkyl group above. The alkynyl group represented by any one of $R^{28}$ to $R^{31}$ includes a straight chain, branched or cyclic alkynyl group having from 2 to 28 carbon atoms. In the substituted alkynyl group, the substituent includes the substituents described for the substituted alkyl group above. The heterocyclic group represented by any one of $R^{28}$ to $R^{31}$ includes a 5-membered or more heterocyclic group, preferably a 5-membered, 6-membered or 7-membered heterocyclic group, containing at least one hetero atom selected from a nitrogen atom, a sulfur atom and an oxygen atom. The heterocyclic group may have a condensed ring. In the substituted heterocyclic group, the substituent includes the substituents described for the substituted aryl group above. Specific examples of the compound represented by formula (5) include compounds described in U.S. Pat. Nos. 3,567,453 and 4,343,891, European Patents 109,772 and 109,773, and the following compounds:

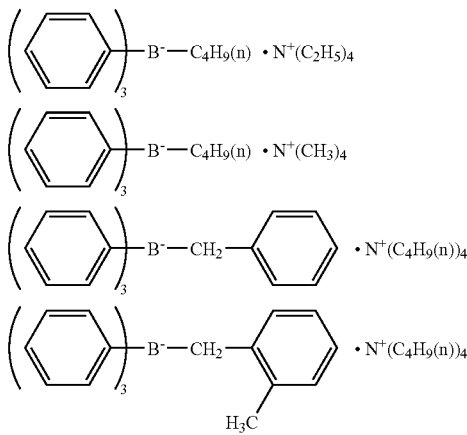

(h) Azinium Compound

The azinium compound (h) preferably used as the polymerization initiator in the invention includes compounds having an N—O bond as described in JP-A-63-138345, JP-A-63-142345, JP-A-63-142346, JP-A-63-143537 and JP-B-46-42363.

(i) Metallocene Compound

The metallocene compound (i) preferably used as the polymerization initiator in the invention includes titanocene compounds as described in JP-A-59-152396, JP-A-61-151197, JP-A-63-41484, JP-A-2-249 and JP-A-2-4705, and iron-arene complexes as described in JP-A-1-304453 and JP-A-1-152109.

Specific examples of the titanocene compound include dicyclopentadienyl-Ti-dichloride,
dicyclopentadienyl-Ti-biphenyl,
dicyclopentadienyl-Ti-bis-2,3,4,5,6-pentafluorophen-1-yl,
dicyclopentadienyl-Ti-bis-2,3,5,6-tetrafluorophen-1-yl,
dicyclopentadienyl-Ti-bis-2,4,6-trifluorophen-1-yl,
dicyclopentadienyl-Ti-bis-2,6-difluorophen-1-yl,
dicyclopentadienyl-Ti-bis-2,4-difluorophen-1-yl,
dimethylcyclopentadienyl-Ti-bis-2,3,4,5,6-pentafluorophen-1-yl, dimethylcyclopentadienyl-Ti-bis-2,3,5,6-tetrafluorophen-1-yl,
dimethylcyclopentadienyl-Ti-bis-2,4-difluorophen-1-yl,
bis(cyclopentadienyl)bis[2,6-difluoro-3-(pyr-1-yl)phenyl]titanium,
bis(cyclopentadienyl)bis[2,6-difluoro-3-(methylsulfonamido)phenyl]titanium,
bis(cyclopentadienyl)bis[2,6-difluoro-3-(N-butylpivaloylamino)phenyl]titanium,
bis(cyclopentadienyl)bis[2,6-difluoro-3-(N-butyl-(4-chlorobenzoyl)amino)phenyl]titanium,
bis(cyclopentadienyl)bis(2,6-difluoro-3-(N-benzyl-2,2-dimethylpentanoylamino)phenyl]titanium,
bis(cyclopentadienyl)bis(2,6-difluoro-3-(N-(2-ethylhexyl)-4-tolylsultonylamino)phenyl]titanium,
bis(cyclopentadienyl)bis[2,6-difluoro-3-(N-(3-oxaheptyl)benzoylamino)phenyl]titanium,
bis(cyclopentadienyl)bis[2,6-difluoro-3-(N-(3,6-dioxadecyl)benzoylamino)phenyl]titanium,
bis(cyclopentadienyl)bis[2,6-difluoro-3-(trifluoromethylsultonylamino)phenyl]titanium,
bis(cyclopentadienyl)bis[2,6-difluoro-3-(trifluoroacetylamino)phenyl]titanium,
bis(cyclopentadienyl)bis[2,6-difluoro-3-(2-chlorobenzoylamino)phenyl]titanium,
bis(cyclopentadienyl)bis[2,6-difluoro-3-(4-chlorobenzoylamino)phenyl]titanium,
bis(cyclopentadienyl)bis[2,6-difluoro-3-(N-(3,6-dioxadecyl)-2,2-dimethylpentanoylamino) phenyl]titanium,
bis(cyclopentadienyl)bis[2,6-difluoro-3-(N-(3,7-dimethyl-7-methoxyoctyl)benzoylamino)phenyl]titanium and
bis(cyclopentadienyl)bis[2,6-difluoro-3-(N-cyclohexylbenzoylamino)phenyl]titanium.

(j) Active Ester Compound

The active ester compound (j) preferably used as the polymerization initiator in the invention includes imidosulfonate compounds as described in JP-B-62-6223, and active sulfonates as described in JP-B-63-14340 and JP-A-59-174831.

(k) Compound Having a Carbon-halogen Bond

The compound having a carbon-halogen bond (k) preferably used as the polymerization initiator in the invention includes the compounds represented by the following formulae (6) to (12):

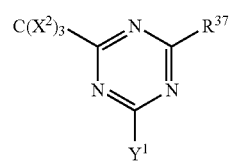

(6)

In formula (6), $X^2$ represents a halogen atom; $Y^1$ represents $-C(X^2)_3$, $-NH_2$, $-NHR^{38}$, $-N(R^{38})_2$ or $-OR^{38}$; $R^{38}$ represents an alkyl group, a substituted alkyl group, an aryl group or a substituted aryl group; and $R^{37}$ represents $-C(X^2)_3$, an alkyl group, a substituted alkyl group, an aryl group, a substituted aryl group or a substituted alkenyl group.

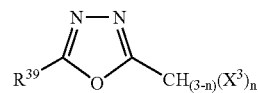

(7)

In formula (7), $R^{39}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group; $X^3$ represents a halogen atom; and n represents an integer of from 1 to 3.

In formula (8), $R^{40}$ represents an aryl group or a substituted aryl group; $R^{41}$ represents a group shown below or a halogen atom; $Z^6$ represents —C(=O)—, —C(=S)— or —SO$_2$—.

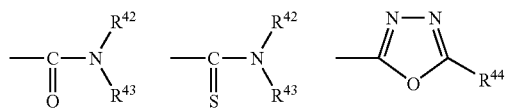

wherein $R^{42}$ and $R^{43}$ each represent an alkyl group, a substituted alkyl group, an alkenyl group, a substituted alkenyl group, an aryl group or a substituted aryl group; $R^{44}$ has the same meaning as defined for $R^{38}$ in formula (6); $X^3$ represents a halogen atom; and m represents 1 or 2.

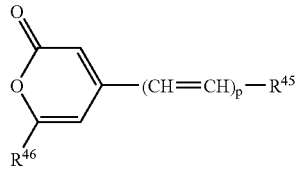

In formula (9), $R^{45}$ represents an aryl group which may be substituted or a heterocyclic group which maybe substituted; $R^{46}$ represents a trihaloalkyl group or trihaloalkenyl group each having from 1 to 3 carbon atoms; and p represents 1, 2 or 3.

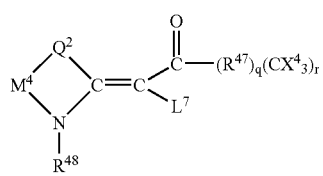

In formula (10), which represents a carbonyl methylene heterocyclic compound having a trihalogenomethyl group, $L^7$ represents a hydrogen atom or a group represented by formula —CO—$(R^{47})_q(C(X^4)_3)_r$; Q represents a sulfur atom, a selenium atom, an oxygen atom, a dialkylmethylene group, an alken-1,2-ylene group, a 1,2-phenylene group or —N(—$R^{48}$)—; $M^4$ represents a substituted or unsubstituted alkylene group, a substituted or unsubstituted alkenylene group or a 1,2-arylene group; $R^{48}$ represents an alkyl group, an aralkyl group or an alkoxyalkyl group; $R^{47}$ represents a divalent carbocyclic or heterocyclic aromatic group; $X^4$ represents a chlorine atom, a bromine atom or an iodine atom; q represents 0 or 1; and r represents 1 or 2, provided that when q represents 0, r represents 1, and when q represents 1, r represents 1 or 2.

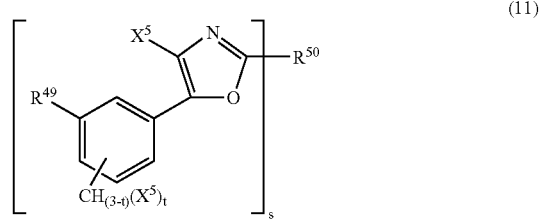

In formula (11), which represents a 4-halogeno-5-(halogenomethylphenyl)oxazole derivative, $X^5$ represents a halogen atom, t represents an integer of from 1 to 3; s represents an integer of from 1 to 4; $R^{49}$ represents a hydrogen atom or —CH$_{3-t}$X$^5_t$; and $R^{50}$ represents an s-valent unsaturated organic residue, which may be substituted.

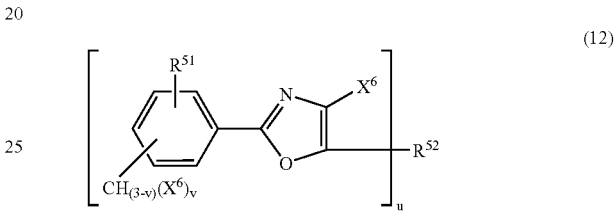

In formula (12), which represents a 2-(halogenomethylphenyl)-4-halogenooxazole derivative, $X^6$ represents a halogen atom, v represents an integer of from 1 to 3; u represents an integer of from 1 to 4; $R^{51}$ represents a hydrogen atom or —CH$_{3-v}$X$^6_v$; and $R^{52}$ represents an u-valent unsaturated organic residue, which may be substituted.

Specific examples of the compound having a carbon-halogen bond include compounds as described in Wakabayashi et al., *Bull. Chem. Soc. Japan*, Vol. 42, page 2924 (1969), for example, 2-phenyl-4,6-bis(trichloromethyl)-S-triazine,
2-(p-chlorophenyl)-4,6-bis (trichloromethyl)-S-triazine,
2-(p-tolyl)-4,6-bis(trichloromethyl)-S-triazine,
2-(p-methoxyphenyl)-4,6-bis(trichloromethyl)-S-triazine,
2-(2',4'-dichlorophenyl)-4,6-bis(trichloromethyl)-S-triazine,
2,4,6-tris(trichloromethyl)-S-triazine,
2-methyl-4,6-bis(trichloromethyl)-S-triazine,
2-n-nonyl-4, 6-bis (trichloromethyl)-S-triazine and 2-(α,α,β-trichloroethyl)-4,6-bis(trichloromethyl)-S-triazine;

compounds as described in British Patent 1,388,492, for example,
2-styryl-4,6-bis (trichloromethyl)-S-triazine,
2-(p-methylstyryl)-4,6-bis(trichloromethyl)-S-triazine,
2-(p-methoxylstyryl)-4,6-bis(trichloromethyl)-S-triazine and
2-(p-methoxylstyryl)-4-amino-6-trichloromethyl-S-triazine; and compounds as described in JP-A-53-133428, for example,
2-(4-methoxynaphth-1-yl)-4,6-bis(trichloromethyl)-S-triazine,
2-(4-ethoxynaphth-1-yl)-4,6-bis(trichloromethyl)-S-triazine,
2-[4-(2-ethoxyethyl)naphth-1-yl]-4,6-bis(trichloromethyl)-S-triazine,
2-(4,7-dimethoxynaphth-1-yl)-4,6-bis(trichloromethyl)-S-triazine and 2-(acenaphth-5-yl)-4,6-bis(trichloromethyl)-S-triazine; compounds as described in German Patent 3,337,024, for example, the following compounds:

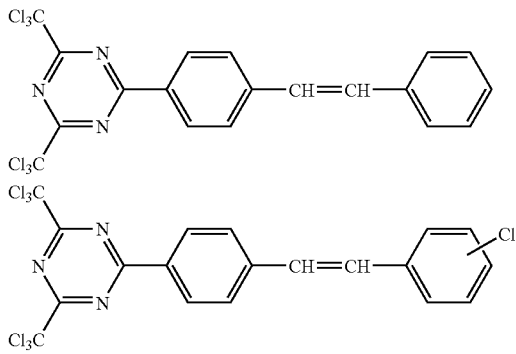

Specific examples of the compound having a carbon-halogen bond also include compounds as described in F. C. Schaefer et al., *J. Org. Chem.*, Vol. 29, page 1527 (1964), for example,
2-methyl-4,6-bis(tribromomethyl)-S-triazine,
2,4,6-tris (tribromomethyl)-S-triazine,
2,4,6-tris(dibromomethyl)-S-triazine,
2-amino-4-methyl-6-tribromomethyl-S-triazine and
2-methoxy-4-methyl-6-tribromomethyl-S-triazine; compounds as described in JP-A-62-58241, for example, the following compounds:

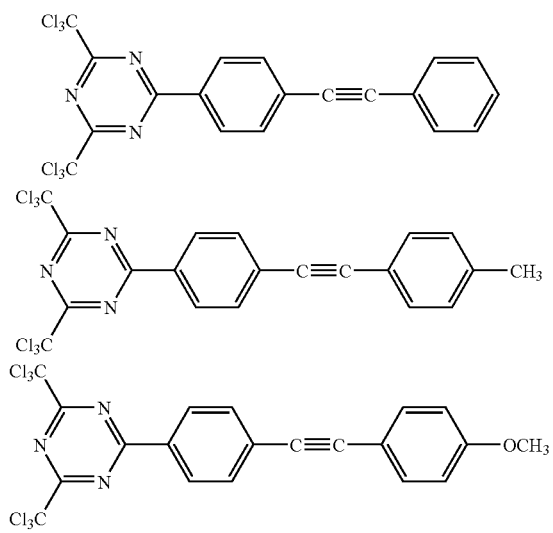

Further, they includes compounds as described in JP-A-5-281728, for example, the following compounds:

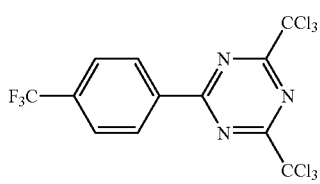

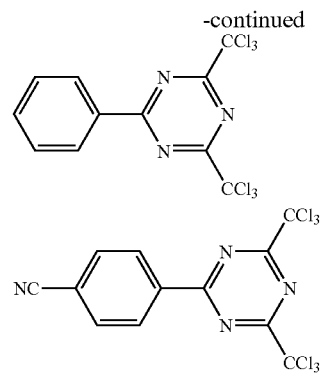

Moreover, they includes compounds, which can be easily synthesized by one skilled in the art according to synthesis methods as described in M. P. Hutt, E. F. Elslager and L. M. Herbel, *Journal of Heterocyclic Chemistry*, Vol. 7, No. 3, page 511 (1970), for example, the following compounds:

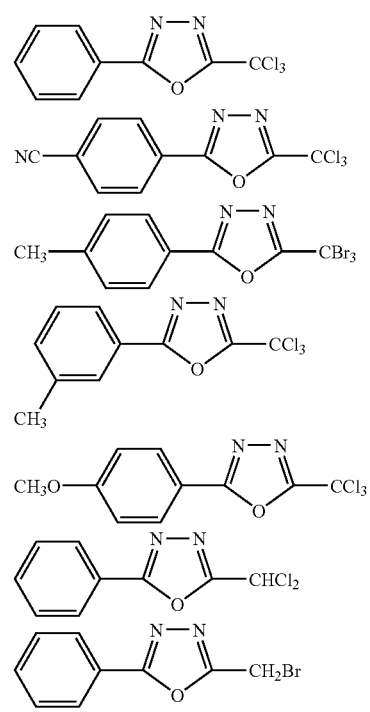

In addition, specific aromatic sulfonium salts as described in JP-A-2002-92127, JP-A-2002-148790 and JP-A-2002-6482 proposed by the applicant are exemplified as preferred polymerization initiators.

Most preferred examples of the polymerization initiator for use in the polymerizable composition of the invention include titanocene compounds, aromatic sulfonium salts and trihalomethyl-S-triazine compounds.

The polymerization initiators (C) may be employed individually or in combination of two or more thereof in the present invention.

The polymerization initiator (C) is preferably added in an amount of from 0.01 to 10% by weight, more preferably from 0.1 to 2% by weight, based on the total solid content of the polymerizable composition of the invention. In case of using in the recording layer of lithographic printing plate precursor, the amount preferably added is same as the above.

[Sensitizing Dye (D)]

The polymerizable composition of the invention preferably contains a sensitizing dye in view of increasing sensitivity. The sensitizing dye includes a spectral sensitizing dye and a dyestuff or pigment that absorbs light of a light source and interacts with the polymerization initiator.

<Spectral Sensitizer or Dyestuff>

The spectral sensitizing dye or dyestuff preferably used as the sensitizing dye in the invention includes a multi-nuclear aromatic compound (for example, pyrene, peryrene or triphenylene), axanthene (for example, Fluoresceine, Eosine, Erythrocin, Rhodamine B or Rose Bengale), a cyanine (for example, thiacarbocyanine or oxacarbocyanine), a merocyanine (for example, merocyanine or carbomerocyanine), a thiazine (for example, Thionine, Methylene Blue or Toluidine Blue), an acridine (for example, Acridine orange, chloroflavine or acriflavine), a phthalocyanine (for example, phthalocyanine or metallo-phthalocyanine), a porphyrin (for example, tetraphenyl porphyrin or center metal-substituted porphyrin), a chlorophyll (for example, chlorophyll, chlorophyllin or center metal-substituted chlorophyll), a metal complex, for example, the compound shown below, an anthraquinone (for example, anthraquinone) and a squalium (for example, squalium).

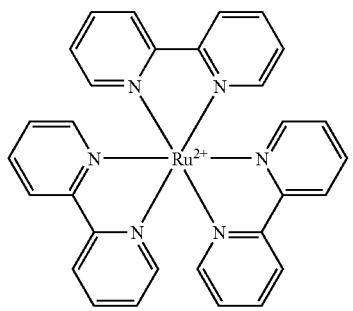

The sensitizing dye is preferably an infrared absorbing agent having an absorption in a wavelength range of from 700 to 1,200 nm or a sensitizing dye having an absorption in a wavelength range of from 350 to 700 nm.

More preferred examples of the spectral sensitizing dye or dyestuff are set forth below.

Styryl dyes as described in JP-B-37-13034, including as preferred specific examples, the following compounds:

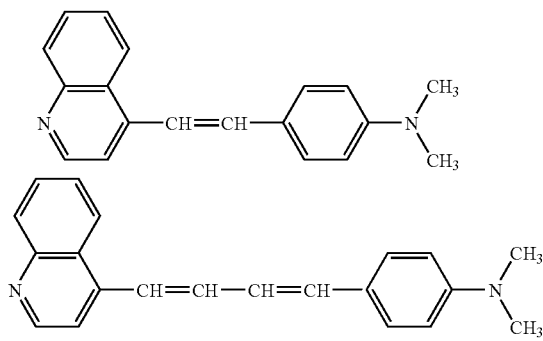

Cationic dyes as described in JP-A-62-143044, including as preferred specific examples, the following compounds:

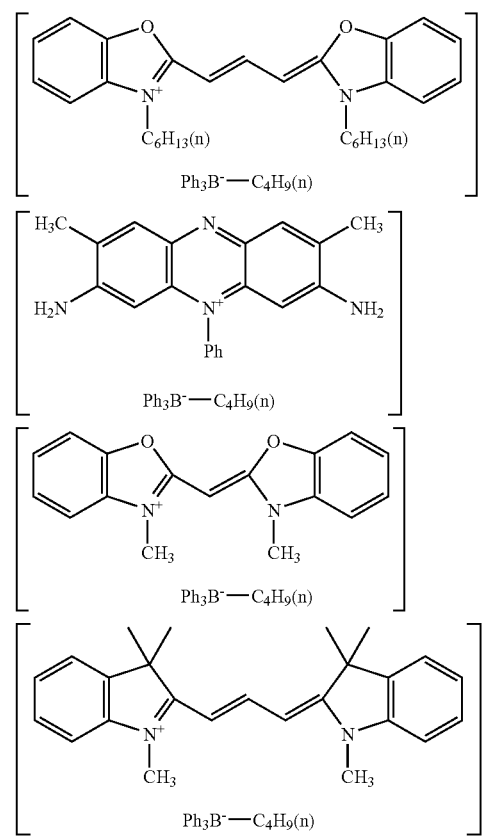

Quinoxalinium salts as described in JP-B-59-24147, including as preferred specific examples, the following compounds:

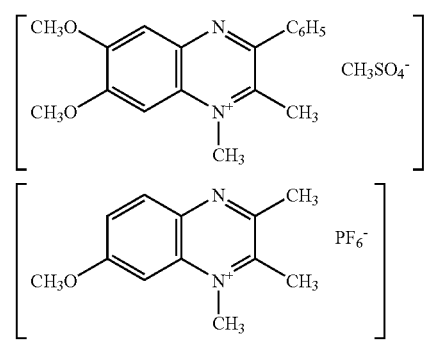

New Methylene Blue compounds as described in JP-A-64-33104, including as preferred specific examples, the following compounds:

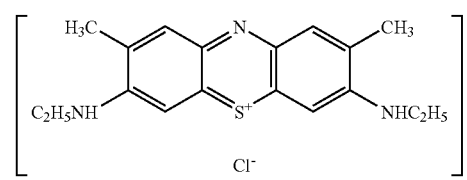

Anthraquinones as described in JP-A-64-56767, including as preferred specific examples, the following compounds:

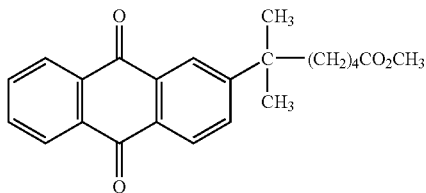

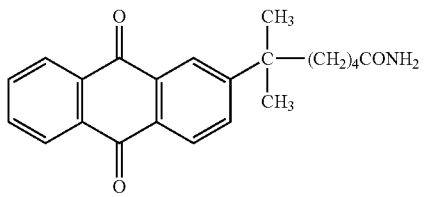

Benzoxanthene dyes as described in JP-A-2-1714 and acridines as described in JP-A-2-226148 and JP-A-2-226149, including as preferred specific examples, the following compounds:

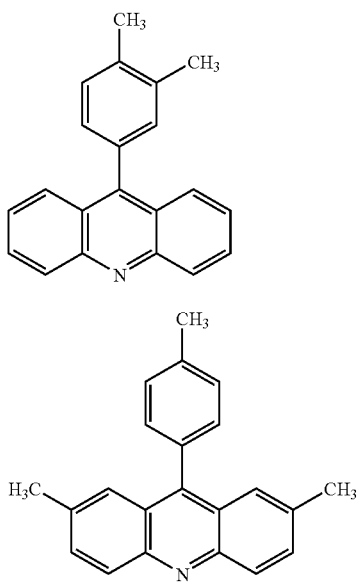

Pyrylium salts as described in JP-B-40-28499, including as preferred specific examples, the following compounds:

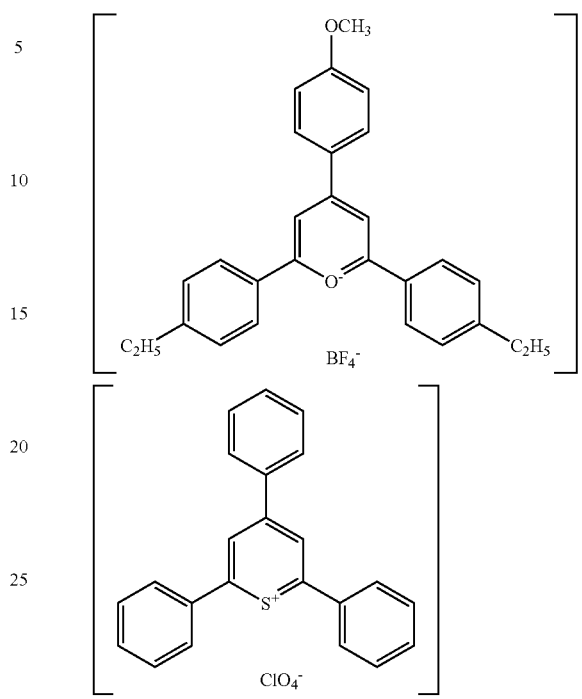

Cyanines as described in JP-B-46-42363, including as preferred specific examples, the following compounds;

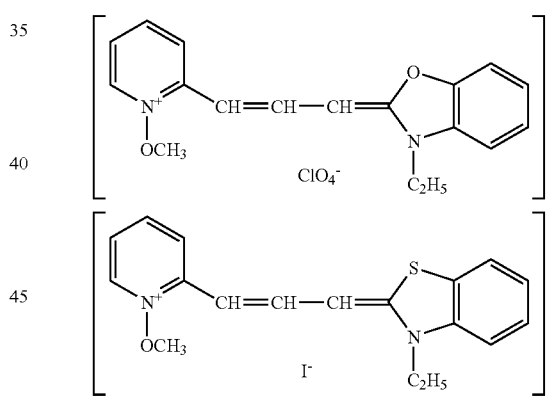

Benzofuran dyes as described in JP-A-2-63053, including as preferred specific examples, the following compounds:

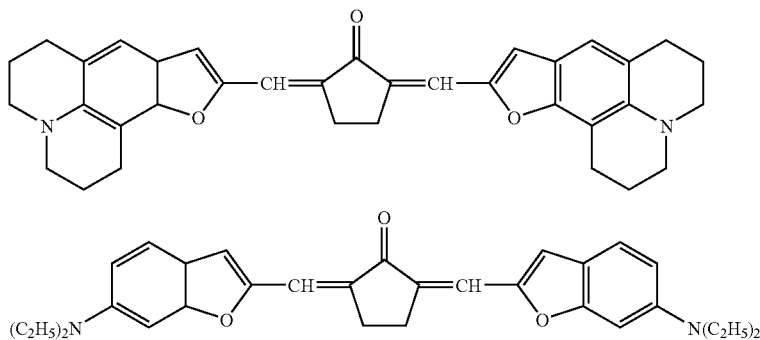

Conjugated ketone dyes as described in JP-A-2-85858 and JP-A-2-216154, including as preferred specific examples, the following compounds:

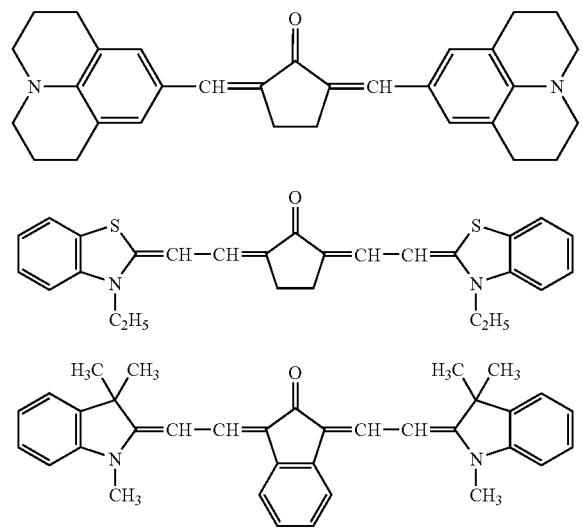

Dyes as described in JP-A-57-10605 and azocinnamylidene derivatives as described in JP-B-2-30321, including as preferred specific examples, the following compounds:

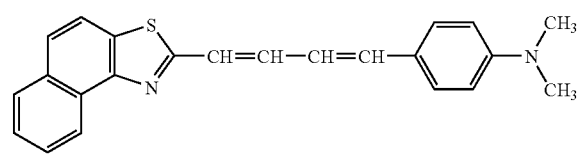

Cyanine dyes as described in JP-A-1-287105, including as preferred specific examples, the following compounds:

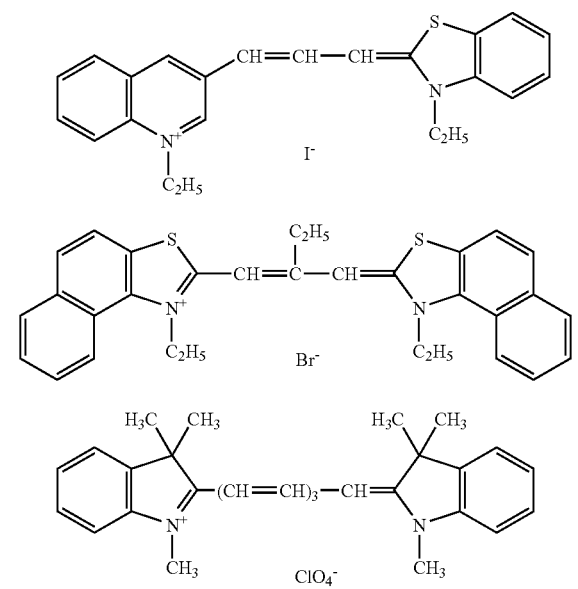

Xanthene dyes as described in JP-A-62-31844, JP-A-62-31848 and JP-A-62-143043, including as preferred specific examples, the following compounds:

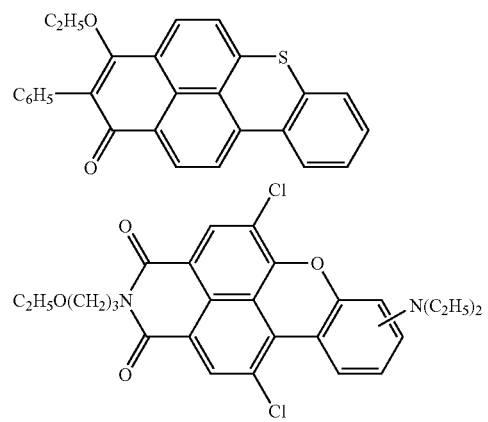

Aminostyryl ketones as described in JP-B-59-28325, including as preferred specific examples, the following compounds:

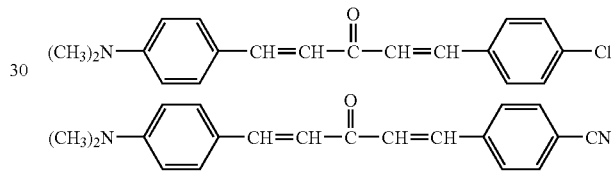

Dyes as described in JP-A-2-179643, for example, those represented by the following formulae (13) to (15):

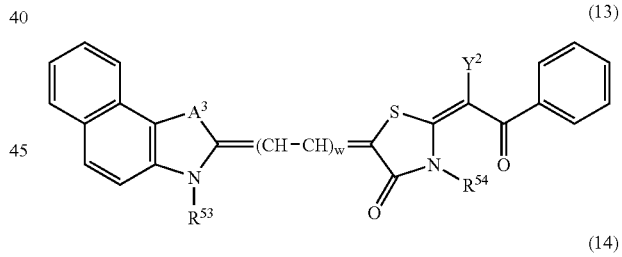

(13)

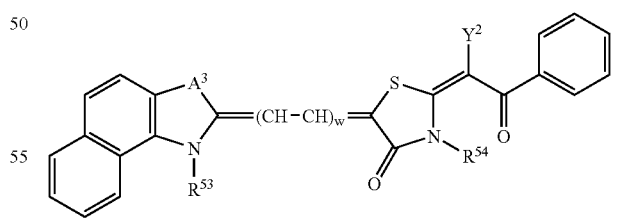

(14)

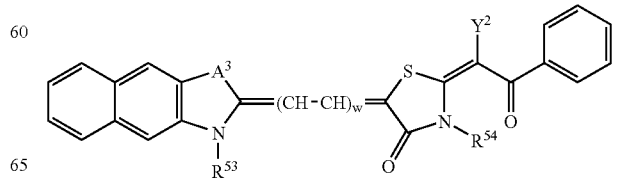

(15)

In formulae (13) to (15), wherein $A^3$ represents an oxygen atom, a sulfur atom, a selenium atom, a tellurium atom, a nitrogen atom substituted with an alkyl group or an aryl group or a carbon atom substituted with two alkyl groups; $Y^2$ represents a hydrogen atom, an alkyl group, a substituted alkyl group, an aryl group, a substituted aryl group, an aralkyl group, an acyl group or a substituted alkoxycarbonyl group; $R^{53}$ and $R^{54}$ each represent a hydrogen atom, an alkyl group having from 1 to 18 carbon atoms or a substituted alkyl group having from 1 to 18 carbon atoms and including as the substituent, $—OR^{55}$, $—(CH_2CH_2O)_w—R^{55}$, a halogen atom (e.g., F, Cl, Br or I) or a group shown below (wherein $R^{55}$ represents a hydrogen atom or an alkyl group having from 1 to 10 carbon atoms; $B^1$ represents a dialkylamino group, a hydroxy group, an acyloxy group, a halogen atom or a nitro group); and w represents an integer of from 0 to 4.

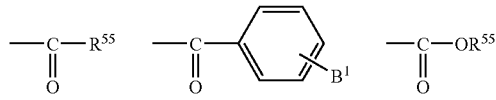

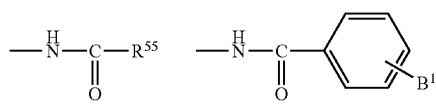

Merocyanine dyes as described in JP-A-2-244050, for example, those represented by the following formula [16]:

(16)

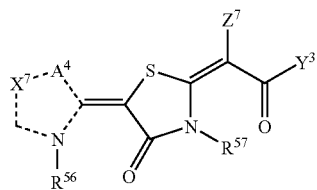

In formula (16), $R^{56}$ and $R^{57}$ each independently represent a hydrogen atom, an alkyl group, a substituted alkyl group, an alkoxycarbonyl group, an aryl group, a substituted aryl group or an aralkyl group; $A^4$ represents an oxygen atom, a sulfur atom, a selenium atom, a tellurium atom, a nitrogen atom substituted with an alkyl group or an aryl group or a carbon atom substituted with two alkyl groups; $X^7$ represents a non-metallic atomic group necessary for forming a nitrogen-containing 5-membered heterocyclic ring; $Y^3$ represents a substituted phenyl group, an unsubstituted or substituted multinuclear aromatic ring or an unsubstituted or substituted heteroaromatic ring; and $Z^7$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, or $Z^7$ and $Y^3$ may be combined with each other to form a ring; and preferred specific examples of the merocyanine dye including the following compounds:

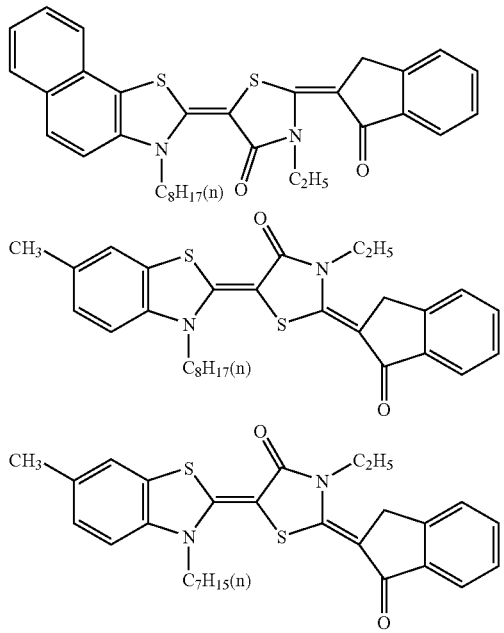

Merocyanine dyes as described in JP-B-59-28326, for example, those represented by the following formula (17):

(17)

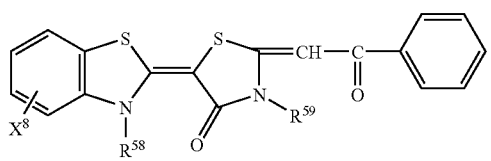

In formula (17), $R^{58}$ and $R^{59}$, which may be the same or different, each represent a hydrogen atom, an alkyl group, a substituted alkyl group, an aryl group, a substituted aryl group or an aralkyl group; and $X^8$ represents a substituent having a Hammett sigma (σ) value ranging from −0.9 to +0.5.

Merocyanine dyes as described in JP-A-59-89303, for example, those represented by the following formula (18):

(18)

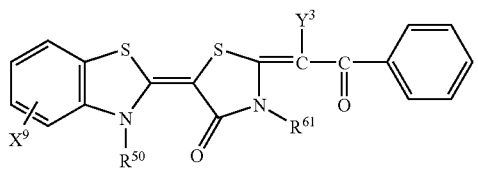

In formula (18), $R^{60}$ and $R^{61}$ each independently represent a hydrogen atom, an alkyl group, a substituted alkyl group, an aryl group, a substituted aryl group or an aralkyl group; $X^9$ represents a substituent having a Hammett sigma (σ) value ranging from −0.9 to +0.5; and $Y^4$ represents a hydrogen atom, an alkyl group, a substituted alkyl group, an aryl group, a substituted aryl group, an aralkyl group, an acyl group or an alkoxycarbonyl group; and preferred specific examples of the merocyanine dye including the following compounds:

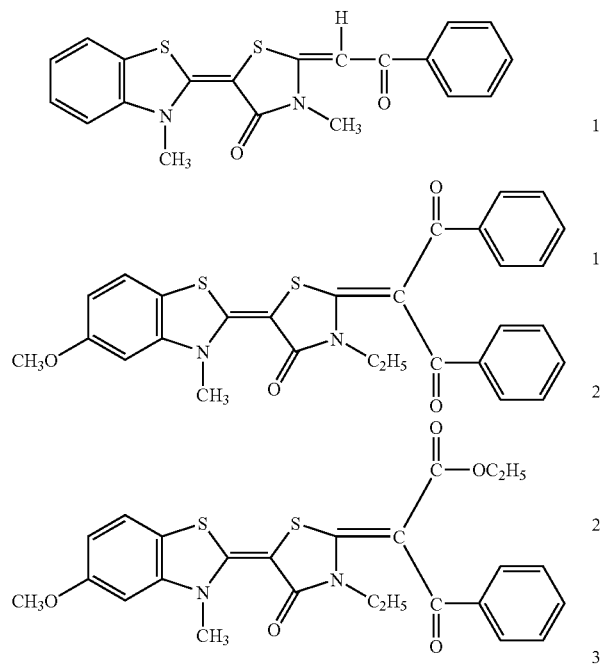

Merocyanine dyes as described in JP-A-8-129257, for example, those represented by the following formula (19):

(19)

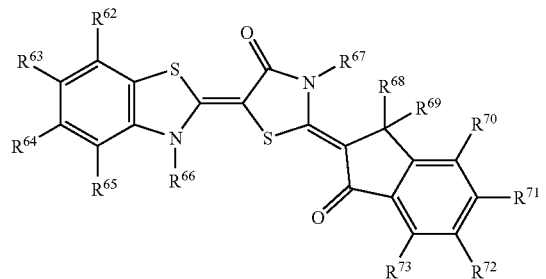

In formula (19), $R^{62}$, $R^{63}$, $R^{64}$, $R^{65}$, $R^{70}$, $R^{71}$, $R^{72}$, $R^{73}$ each independently represent a hydrogen atom, a halogen atom, an alkyl group, a substituted alkyl group, an aryl group, a substituted aryl group, a hydroxy group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phsphonato group, a cyano group or a nitro group, or $R^{62}$ and $R^{63}$, $R^{63}$ and $R^{64}$, $R^{64}$ and $R^{65}$, $R^{70}$ and $R^{71}$, $R^{71}$ and $R^{72}$ or $R^{72}$ and $R^{73}$ may be combined with each other to from an aliphatic ring or an aromatic ring; $R^{66}$ represents a hydrogen atom, an alkyl group, a substituted alkyl group, an aryl group or a substituted aryl group, $R^{67}$ represents a substituted or unsubstituted alkenylalkyl group or a substituted or unsubstituted alkynylalkyl group; and $R^{68}$ and $R^{69}$ each independently represent a hydrogen atom, a halogen atom, an alkyl group, a substituted alkyl group, an aryl group, a substituted aryl group or a substituted carbonyl group; and preferred specific examples of the merocyanine dye including the following compounds:

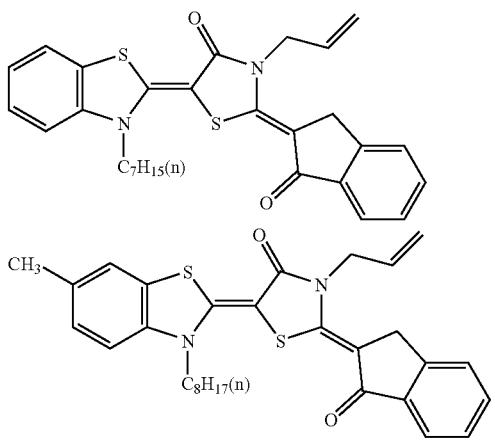

Benzopyran dyes as described in JP-A-8-334897, for example, those represented by the following formula (20):

(20)

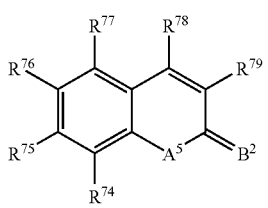

In formula (20), $R^{74}$ to $R^{77}$ each independently represent a hydrogen atom, a halogen atom, an alkyl group, an aryl group, a hydroxy group, an alkoxy group or an amino group, or $R^{74}$ to $R^{77}$ may be combined with each other to form a ring composed of non-metallic atoms together with the carbon atoms; $R^{78}$ represents a hydrogen atom, an alkyl group, an aryl group, a heteroaromatic group, a cyano group, an alkoxy group, a carboxy group or an alkenyl group; $R^{79}$ represents any one of the groups defined for $R^{78}$ or -$Z^7$-$R^{78}$; $Z^7$ represents a carbonyl group, a sulfonyl group, a sulfinyl group or an arylenedicarbonyl group, or $R^{78}$ and $R^{79}$ may be combined with each other to form a ring composed of non-metallic atoms; $A^5$ represents an oxygen atom, a sulfur atom, NH or a nitrogen atom having a substituent; $B^2$ represents an oxygen atom or =C($G^7$) ($G^8$); and $G^7$ and $G^8$, which may be the same or different, each represent a hydrogen atom, a cyano group, an alkoxycarbonyl group, an aryloxycarbonyl group, an acyl group, an arylcarbonyl group, an alkylthio group, an arylthio group, an alkylsulfonyl group, an arylsulfonyl group or a fluorosulfonyl group, provided that $G^7$ and $G^8$ do not represent hydrogen atoms at the same time, or $G^7$ and $G^8$ may be combined with each other to form a ring composed of non-metallic atoms together with the carbon atom.

Further, specific indolenine cyanine dyes as described in JP-A-2002-278057 previously proposed by the inventors are also used as preferred examples.

In addition, the infrared absorbing agents (including dyes and pigments) described below are particularly preferably used as the sensitizing dyes. Preferred examples of the infrared absorbing dye include cyanine dyes as described, for example, in JP-A-58-125246, JP-A-59-84356, JP-A-59-202829and JP-A-60-78787, cyanine dyes as described in British Patent 434,875and specific indolenine cyanine dyes as described above, Other preferred examples of the infrared absorbing dye include near infrared absorbing sensitizers as described in U.S. Pat. No. 5,156,938, substituted arylbenzo (thio)pyrylium salts as described in U.S. Pat. No. 3,881,924, trimethinethiapyrylium salts as described in JP-A-57-142645 (U.S. Pat. No. 4,327,169), pyrylium compounds as described in JP-A-58-181051, JP-A-58-220143, JP-A-59-41363, JP-A-59-84248, JP-A-59-84249, JP-A-59-146063 and JP-A-59-146061, cyanine dyes as described in JP-A-59-216146, pentamethinethiopyrylium salts as described in U.S. Pat. No. 4,283,475, and pyrylium compounds as described in JP-B-5-13514 and JP-B-5-19702.

Other preferred examples of the infrared absorbing dye include near infrared absorbing dyes represented by formulae (I) and (II) in U.S. Pat. No. 4,756,993, and phthalocyanine dyes as described in EP-A-916,513.

Anionic infrared absorbing dyes as described in JP-A-11-338131 are also preferably used. The anionic infrared absorbing dye means a dye that does not have a cation structure in the dye skeleton substantially absorbing an infrared ray and has an anion structure. The anionic infrared absorbing dye includes, for example, (c1) anionic metal complex, (c2) anionic carbon black, (c3) anionic phthalocyanine, and (c4) compound represented by formula (21) shown below. A counter cation of the anionic infrared absorbing dye is a monovalent or polyvalent cation containing a proton.

$$[G^{9*}-M^5-G^{10}]_m(X^{10})^+ \quad (21)$$

The anionic metal complex (c1) is a complex in which the center metal and ligand thereof substantially absorbing light form an anion, as a whole.

The anionic carbon black (c2) includes carbon black having bonded thereto an anion group, for example, sulfonic acid, carboxylic acid or phosphonic acid, as a substituent. In order to introduce the anion group into carbon black, for example, a method of oxidizing carbon black with the desired acid as described in Carbon Black Kyokai ed., *Carbon Black Binran,* Third Edition, page 12, Carbon Black Kyokai (Apr. 5, 1995) can be employed.

The anionic phthalocyanine (c3) is a compound in which the anion group as described in the anionic carbon black (c2) is bonded to a phthalocyanine skeleton as a substituent to form an anion, as a whole.

The compound (c4) represented by formula (21)will be described in detail below.

In formula (21) above, $G^9$ represents an anionic substituent; $G^{10}$ represents a neutral substituent; $(X^{10})^+$ represents an m-valent cation containing a proton; m represents an integer of from 1 to 6; and $M^5$ represents a conjugate chain. The conjugate chain may contain a substituent and/or a cyclic structure. The conjugate chain is represented by the following formula:

wherein $R^{80}$, $R^{81}$ and $R^{82}$ each independently represents a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group, or $R^{80}$, $R^{81}$ and $R^{82}$ may be combined with each other to form a cyclic structure; and n represents an integer of from 1 to 8.

Of the anionic infrared absorbing dyes represented by formula (21), the following compounds IRA-1 to IRA-5 are preferably used.

IRA-1

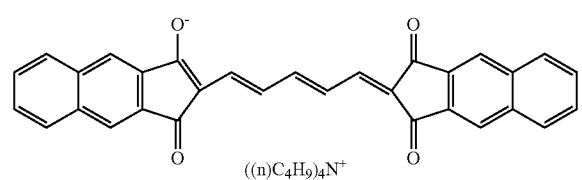

IRA-2

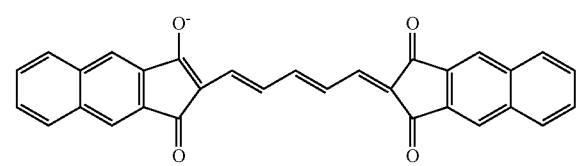

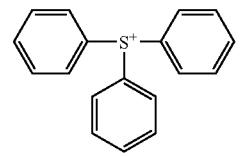

IRA-3

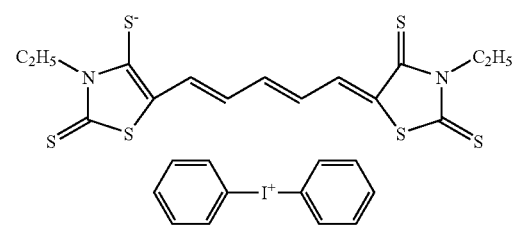

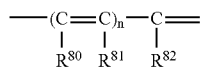

IRA-4

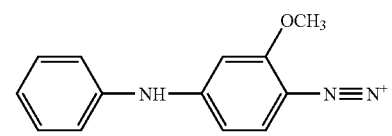

IRA-5

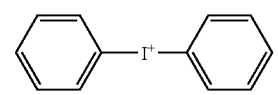

The following cationic infrared absorbing dyes IRC-1 to IRC-44 are also preferably employed.

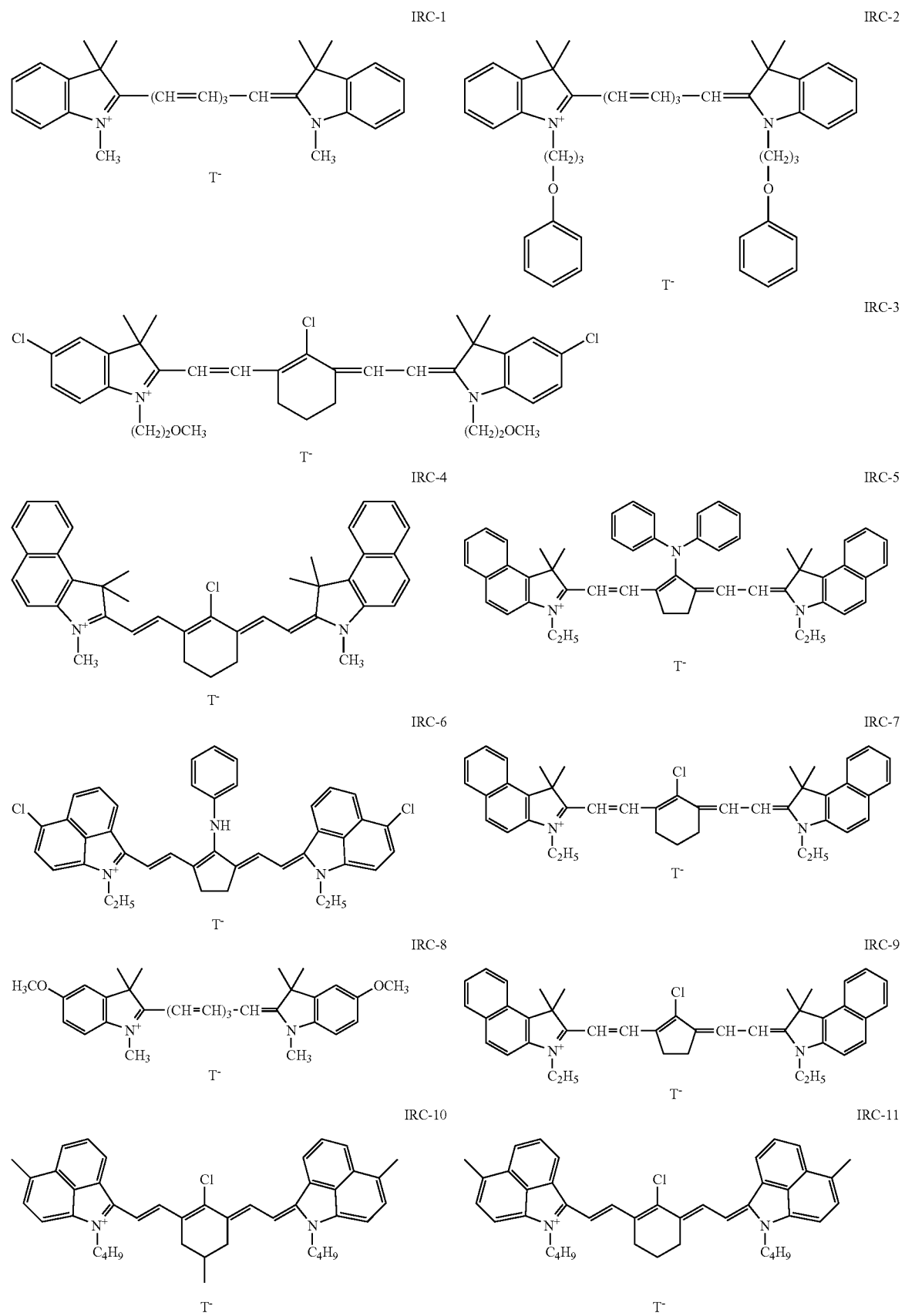

-continued
IRC-12
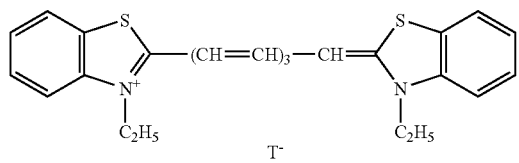
IRC-13
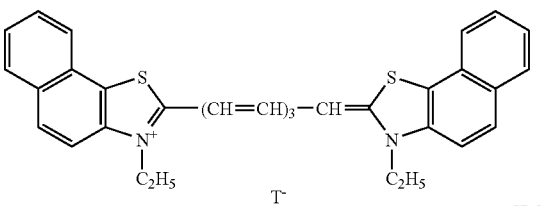
IRC-14
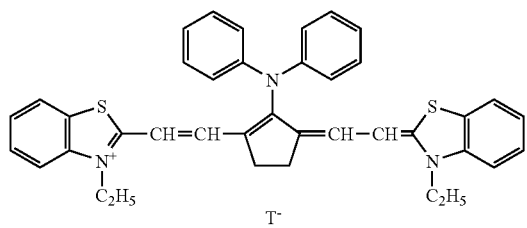
IRC-15
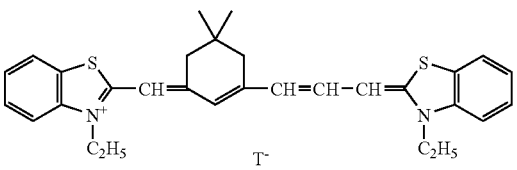
IRC-16
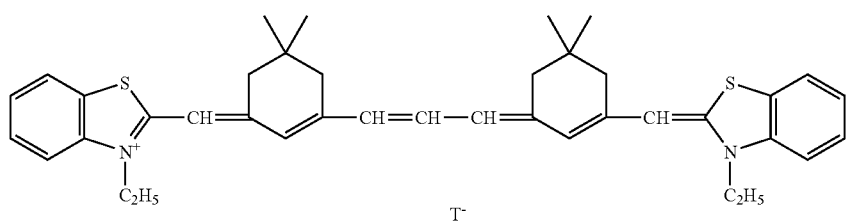
IRC-17
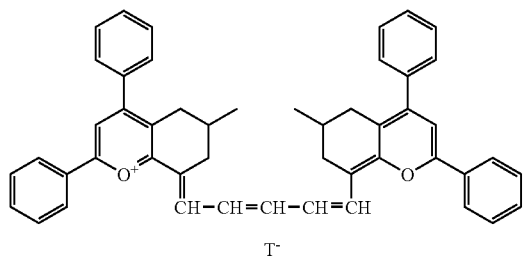
IRC-18
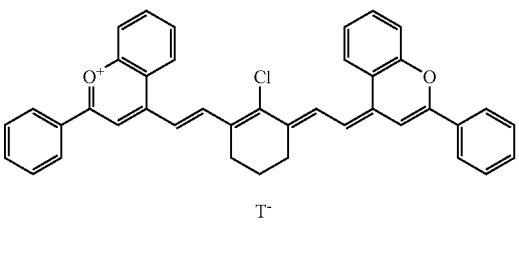
IRC-19
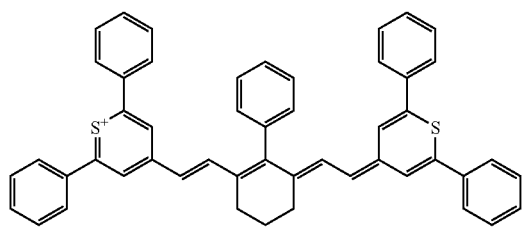
IRC-20
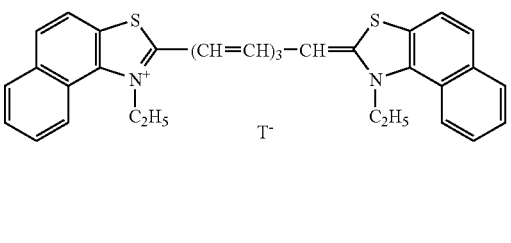
IRC-21
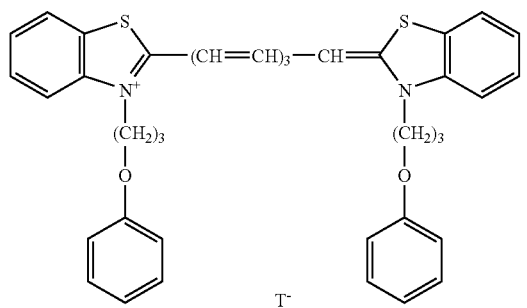

-continued
IRC-22
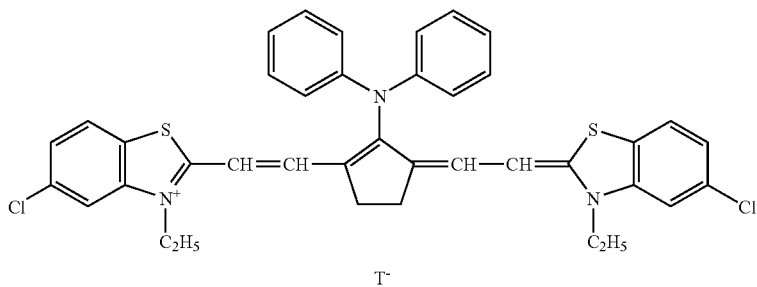
IRC-23  IRC-24
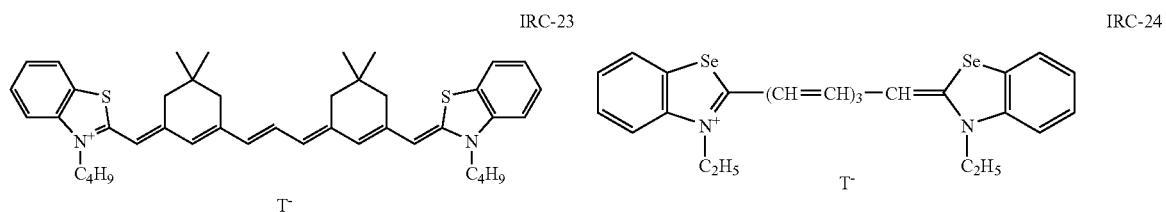
IRC-25  IRC-26
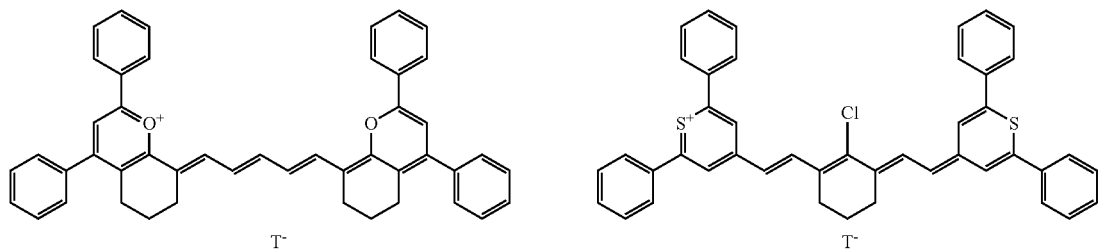
IRC-27  IRC-28
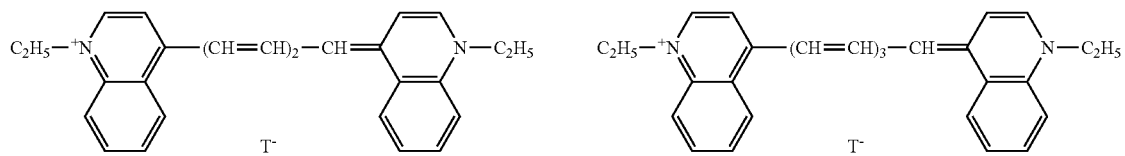
IRC-29  IRC-30
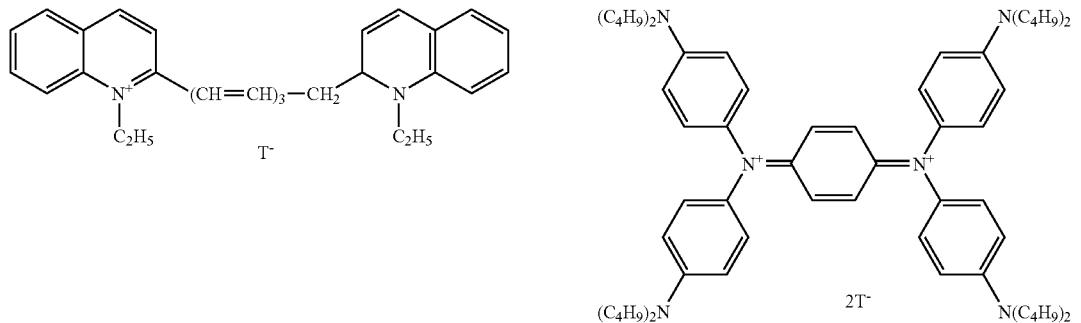

-continued
IRC-31
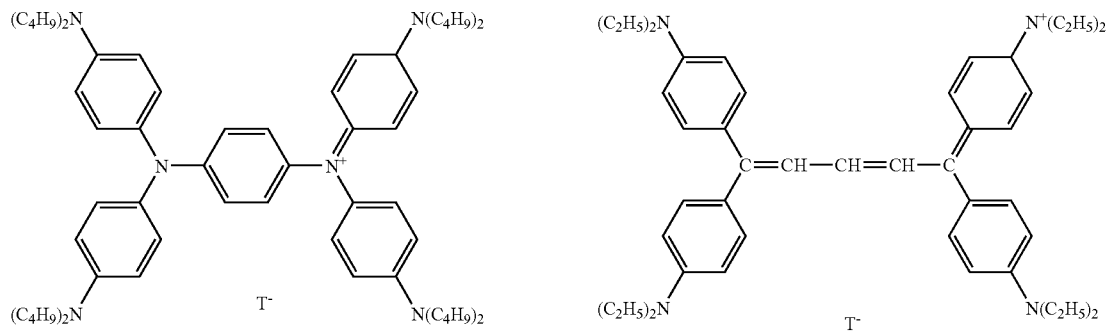
IRC-32
IRC-33
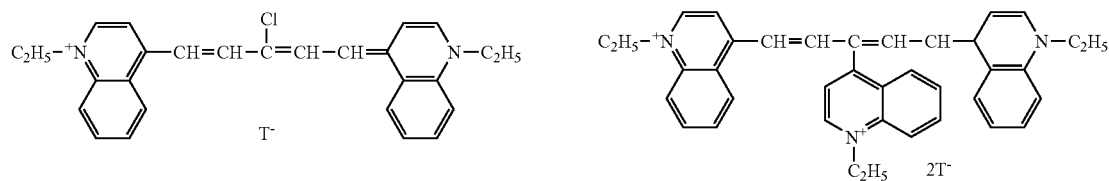
IRC-34
IRC-35
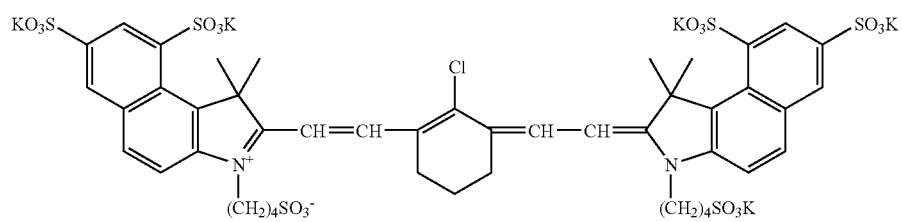
IRC-36
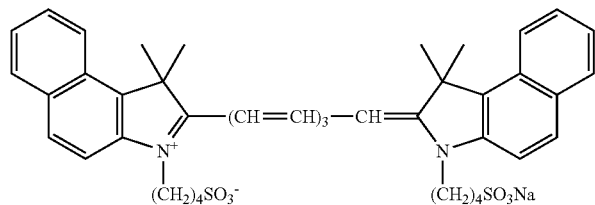
IRC-37
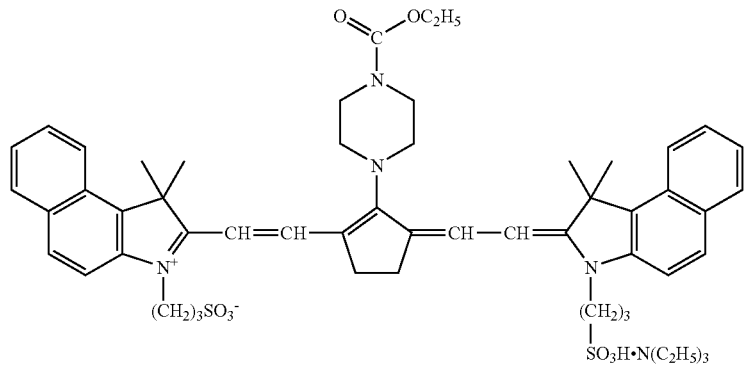

-continued
IRC-38
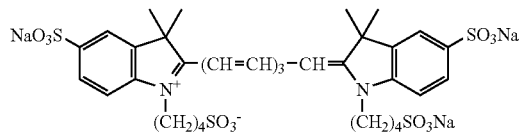
IRC-39
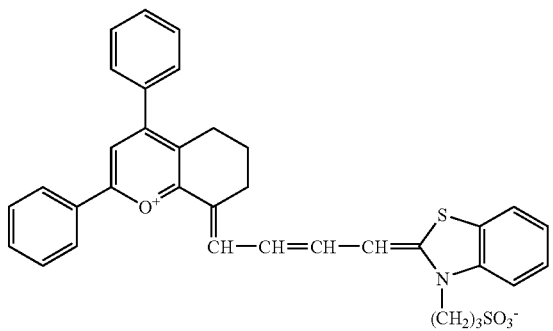
IRC-40
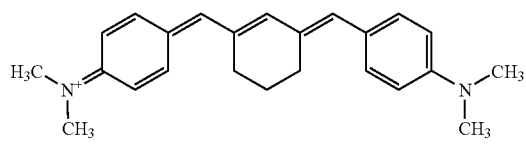
IRC-41
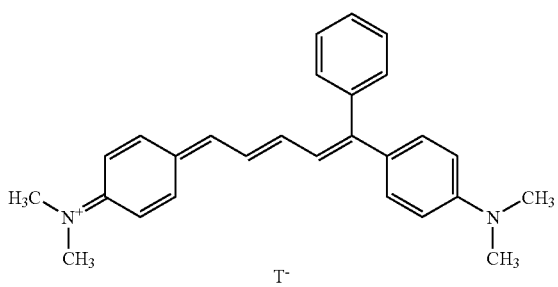
IRC-42
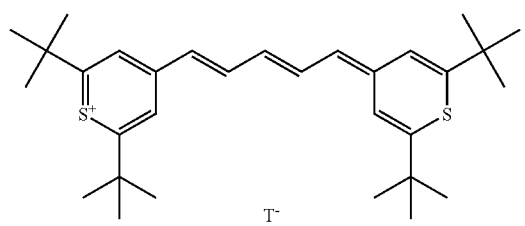
IRC-43
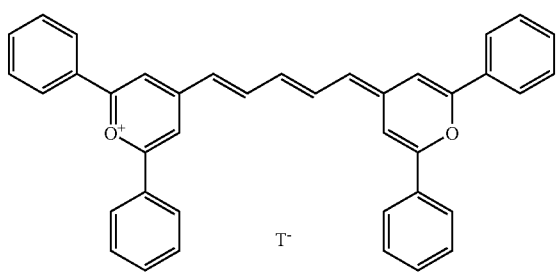
IRC-44
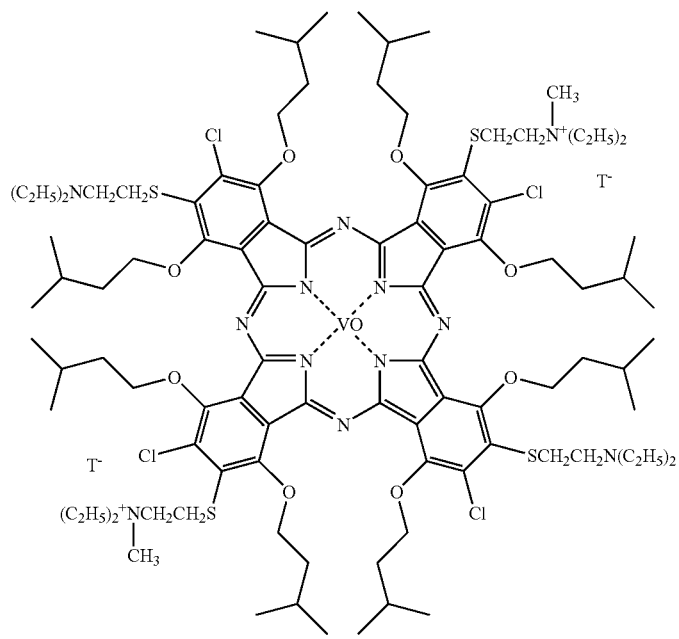

In the above-described formulae, T⁻ represents a monovalent counter anion, preferably a halogen anion (e.g., F⁻, Cl⁻, Br⁻ or I⁻), a Lewis Acid anion (e.g., $BF_4^-$, $PF_6^-$, $SbCl_6^-$ or $ClO_4^-$), an alkylsulfonic acid anion or an arylsulfonic acid anion.

The alkyl group in the alkylsulfonic acid includes a straight chain, branched or cyclic alkyl group having from 1 to 20 carbon atoms. Specific examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, sec-butyl, tert-butyl, isopentyl, neopentyl, 1-methylbutyl, isohexyl, 2-ethylhexyl, 2-methylhexyl, cyclohexyl, cyclopentyl and 2-norbornyl groups. Of the alkyl groups, a straight chain alkyl group having from 1 to 12 carbon atoms, a branched alkyl group having from 3 to 12 carbon atoms and a cyclic alkyl group having from 5 to 10 carbon atoms are preferred.

The aryl group in the arylsulfonic acid includes an aryl group composed of one benzene ring, an aryl group formed by condensing two or three benzene rings and an aryl group formed by condensing a benzene ring and a 5-membered unsaturated ring. Specific examples of the aryl group include phenyl, naphthyl, anthryl, phenanthryl, indenyl, acenaphthenyl and fluorenyl groups. A phenyl group and a naphthyl group are preferred.

Further, the following nonionic infrared absorbing dyes IRN-1 to IRN-9 are also preferably employed.

IRN-1

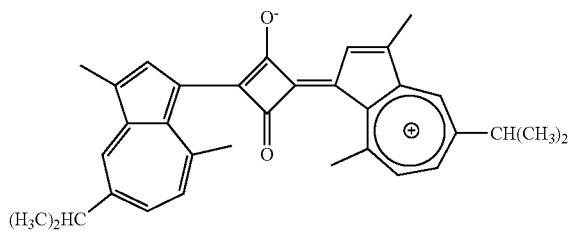

IRN-2

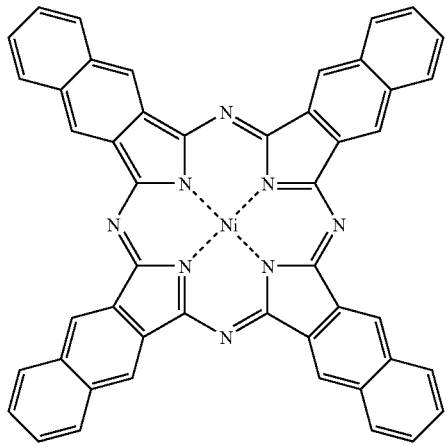

IRN-3

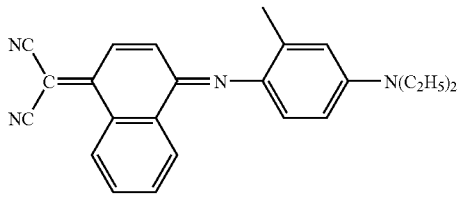

-continued

IRN-4

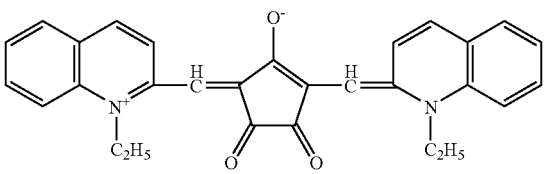

IRN-5

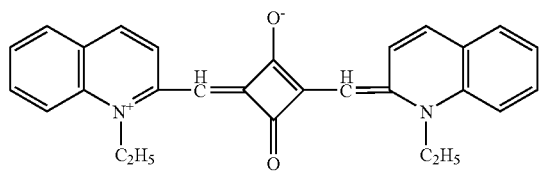

IRN-6

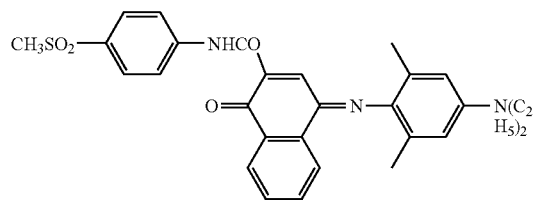

IRN-7

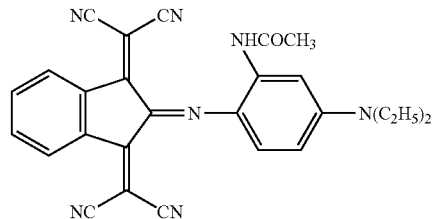

IRN-8

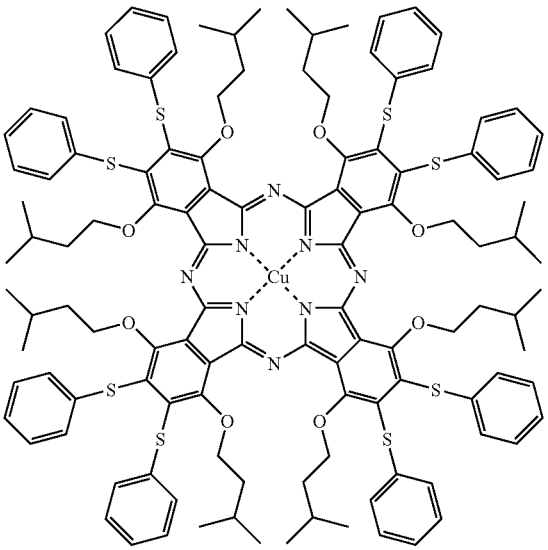

-continued

IRN-9

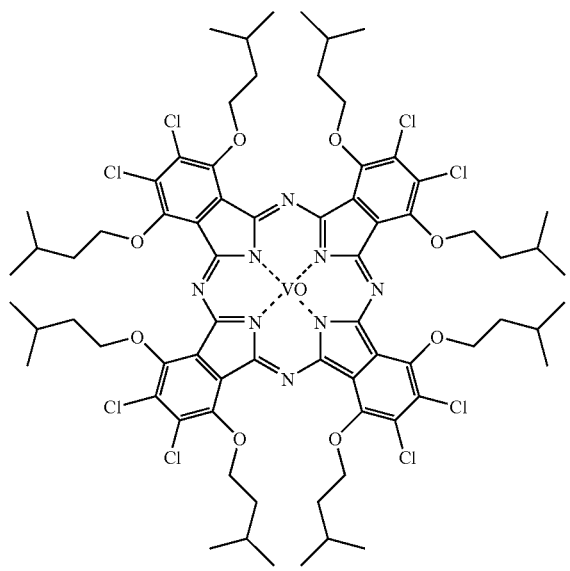

Of the specific compounds described above, IRA-1 is particularly preferred as the anionic infrared absorbing dye, IRC-7, IRC-30, IRC-40 and IRC-42 are particularly preferred as the cationic infrared absorbing dyes, and IRN-9 is particularly preferred as the nonionic infrared absorbing dye.

<Pigment>

Pigments used in the invention include commercially available pigments and pigments described in *Colour Index* (*C.I.*), Nippon Ganryo Gijutsu Kyokai ed., *Saishin Ganryo Binran* (1977), *Saishin Ganryo Oyo Gijutsu,* CMC Publishing Co., Ltd. (1986) and *Insatsu Ink Gijutsu,* CMC Publishing Co., Ltd. (1984).

The pigments include black pigment, yellow pigment, orange pigment, brown pigment, red pigment, purple pigment, blue pigment, green pigment, fluorescent pigment, metal powder pigment, and polymer-bonding dye. Specific examples of the pigment include an insoluble azo pigment, an azo lake pigment, a condensed azo pigment, a chelate azo pigment, a phthalocyanine pigment, an anthraquinone pigment, a perylene pigment, a perynone pigment, a thioindigo pigment, a quinacridone pigment, a dioxazine pigment, an isoindolinone pigment, a quinophthalone pigment, a Reichardt's dye, an azine pigment, a nitroso pigment, a nitro pigment, a natural pigment, a fluorescent pigment, an inorganic pigment, and carbon black. Of the pigments, carbon black is preferably used.

The pigment may be used without surface treatment or the pigment subjected to the surface treatment may be used. Methods of the surface treatment include coating a resin or wax on the surface of pigment, adhering a surface active agent to the surface of pigment and bonding a reactive substance (e.g., a silane coupling agent, an epoxy compound or a polyisocyanate) to the surface of pigment. The methods of surface treatment are described in *Kinzoku Sekken no Seishitu to Oyo,* Miyuki Shobo, *Insatsu Ink Gijutsu,* CMC Publishing Co., Ltd. (1984) and *Saishin Ganryo Oyo Gijutsu,* CMC Publishing Co., Ltd. (1986).

A particle size of the pigment is preferably from 0.01 to 10 μm, more preferably from 0.05 to 1 μm, and particularly preferably from 0.1 to 1 μm. The pigment having a particle size of less than 0.01 μm is not preferred in view of the dispersion stability of pigment in a coating solution for the recording layer. On the other hand, the pigment having a particle size exceeding 10 μm is not preferred in view of the uniformity of the recording layer.

Known dispersing technique used in the production of ink and toner can be utilized for dispersing the pigment. A dispersing machine, for examples an ultrasonic dispersing device, a sand mill, an attriter, a pearl mill, a super mill, a ball mill, an impeller, a disperser, a KD mill, a colloid mill, Dynatron, a three-roll mill or a pressure kneader can be used for dispersion. Details thereof are described in *Saishin Ganryo Oyo Gijutsu,* CMC Publishing Co., Ltd. (1986).

Although the sensitizing dye, which is used in order to accelerate a curing reaction of the polymerizable composition of the invention, is directly added to the polymerizable composition together with other components, the same effect can be obtained by providing adjacent another layer and adding the sensitizing dye thereto.

In particular, when the polymerizable composition of the invention is used in a negative recording layer of a lithographic printing plate precursor described hereinafter, the sensitizing dye may be added to the recording layer or another layer provided separately. It is preferred to adjust optical density of the recording layer at the maximum absorption in a wavelength range of from 300 to 1,200 nm to 0.1 to 3.0 in a negative lithographic printing plate precursor prepared. When the optical density departs from this range, the sensitivity tends to decrease. Since the optical density is determined by the amount of sensitizing dye added and thickness of the recording layer, the desired optical density can be obtained by controlling both factors.

The optical density of the recording layer can be determined according to conventional methods. Methods for measurement include, for example, a method wherein a recording layer is formed on a transparent support so that the coating amount after drying becomes a thickness necessary for a lithographic printing plate and the optical density thereof is measured by a transmission optical densitometer and a method wherein the recoding layer is formed on a reflective support, for example, an aluminum plate and the reflection density thereof is measured.

When the sensitizing dye (D) is used in the invention, a molar ratio of the polymerization initiator (C) to the sensitizing dye in the polymerizable composition is ordinarily from 99:1 to 1:99, more preferably from 90:10 to 10:90, and most preferably from 80:20 to 20:80.

Into the polymerizable composition according to the invention, known compounds, which function for further increasing the sensitivity or preventing the polymerization inhibition due to oxygen, maybe incorporated as cosensitizers.

Examples of the cosensitizer include amine compounds as described in M. R. Sander, *Journal of Polymer Society,* Vol., 10, page 3173 (1972), JP-B-44-20189, JP-A-51-82102, JP-A-52-134692, JP-A-59-138205, JP-A-60-84305, JP-A-62-18537, JP-A-64-33104 and *Research Disclosure,* No. 33825, and specifically, for example, triethanolamine, ethyl p-dimethylaminobenzoate, p-formyldimethylaniline and p-methylthiodimethylaniline.

Other examples of the cosensitizer include thiol compounds as described in JP-A-53-702, JP-B-55-50806 and JP-A-5-142772, and disulfide compounds as described in JP-A-56-75643, and specifically, for example, 2-mercaptobenzothiazole, 2-mercaptobenzoxazole, 2-mercaptobenzimidazole, 2-mercapto-4(3H)-quinazoline and β-mercaptonaphthalene.

Still other examples of the cosensitizer include amino acid compounds (e.g., N-phenylglycine, N-phenyliminodiacetic acid or a derivative thereof), organometal compounds (e.g., tributyl tin acetate) as described in JP-B-48-42965, hydrogen donors as described in JP-B-55-34414, sulfur compounds (e.g., trithiane) as described in JP-A-6-308727, phosphorus compounds (e.g., diethylphosphite) as described in JP-A-6-250389, and Si—H or Ge—H compounds as described in Japanese Patent Application No. 6-191605.

When the cosensitizer is used, the amount thereof is suitably from 0.01 to 50 parts by weight, more preferably from 0.02 to 20 parts by weight, and most preferably form 0.05 to 10 parts by weight, per one pert by weight of the polymerization initiator.

[Other Component]

To the polymerizable composition of the invention, various additives, for example, a laser beam absorbing agent, a coloring agent, a plasticizer or a polymerization inhibitor maybe added, if desired, in addition to the components described above.

It is desired that a small amount of a thermal polymerization inhibitor be added to the polymerizable composition of the invention in order to prevent undesirable thermal polymerization of the compound having a polymerizable ethylenically unsaturated double bond included in the polymerizable composition during the production and preservation of thereof.

Suitable examples of the thermal polymerization inhibitor include hydroquinone, p-methoxyphenol, di-tert-butyl-p-cresol, pyrogallol, tertbutylcatechol, benzoquinone, 4,4'-thiobis(3-methyl-6-tert-butylphenol), 2,2'-methylenebis(4-methyl-6-tert-butylphenol) and N-nitrosophenylhydroxylamine primary cerium salt.

The amount of thermal polymerization inhibitor added is preferably from about 0.01 to about 5% by weight based on the total amount of the polymerizable composition.

Also, if desired, a higher fatty acid derivative, for example, behenic acid or behenic acid amide may be added so as to make maldistribution thereof on the surface of recprding layer during the drying process after the coating of the polymerizable composition in order to prevent the polymerization inhibition due to oxygen. The amount of higher fatty acid derivative added is preferably from about 0.5 to about 10% by weight based on the total amount of the polymerizable composition.

A dye or pigment may be added for the purpose of coloring the recording layer. By the addition of coloring agent, a lithographic printing plate can be improved in plate inspection properties, for example, visibility after the plate-making or suitability for image density measurement, when the polymerizable composition of the invention is applied to a lithographic printing plate precursor. The coloring agent used is preferably a pigment because many dyes are apt to cause reduction in exposure sensitivity of the polymerizable composition. This should be taken into consideration, when dye is used as the coloring agent. Specific examples of the coloring agent include pigments, for example, a phthalocyanine pigment, an azo pigment, carbon black or titanium oxide, and dyes, for example, Ethyl Violet, Crystal Violet, an azo dye, an anthraquinone dye or a cyanine dye. The amount of dye or pigment added is preferably from about 0.5 to about 5% by weight based on the total amount of the polymerizable composition.

Known other additives, for example, an inorganic filler or plasticizer for improving physical properties of the cured film, or an oil sensitivity imparting agent capable of improving an ink-receptive property on the surface of recording layer, may also be added to the polymerizable composition in addition to the additives described above.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin. When a binder is used, the plasticizer may be added in an amount of not more than 10% by weight based on the total amount of the compound having an ethylenically unsaturated double bond and the binder.

Further, in order to improve the film strength (printing durability) of a lithographic printing plate precursor described hereinafter, an UV initiator or a heat crosslinking agent capable of accelerating the effect of heating and/or light exposure treatment after the development may also be used.

The polymerizable composition of the invention can be applied to not only to a lithographic printing plate precursor described hereinafter but also to the production of high-sensitive photomolding materials, hologram materials utilizing change in a refractive index resulting from polymerization and electronic materials, for example, a photoresist.

[Lithographic Printing Plate Precursor]

The polymerizable composition of the invention can be suitably used for a negative recording layer of a lithographic printing plate precursor. The lithographic printing plate precursor using the polymerizable composition will be described below. The lithographic printing plate precursor according to the invention comprises a support having provided thereon a recording layer containing the polymerizable composition of the invention and, if desired, other layers.

(Recording Layer)

The recording layer (photosensitive layer) in the lithographic printing plate precursor according to the invention is a polymerizable photosensitive layer containing a radical polymerizable composition comprising as the essential components, the alkali-soluble polymer (A) (specific block polymer), the polymerizable compound (B) (also referred to as an addition-polymerizable compound) and the polymerization initiator (C). The polymerizable photosensitive layer has a mechanism in which the polymerization initiator is decomposed with a laser beam to generate a radical and a polymerization reaction of the polymerizable compound occurs by the radical generated. The lithographic printing plate precursor according to the invention is particularly suitable for plate-making by direct drawing using a laser beam having a wavelength of from 300 to 1,200 nm, and it provides excellent printing durability and image-forming property in comparison with conventional lithographic printing plate precursors.

In order to improve adhesion between the recording layer and a support or to increase removability of the unexposed area of the recording layer by development, an interlayer may be provided.

Also, a compound having an interaction with the support may be added to the recording layer. Examples of the compound include a compound having a diazonium structure and a phosphone compound. The compound is used by adding to the recording layer or a coating solution for forming an undercoat layer to improve the adhesion to the support, thereby increasing the printing durability. On the other hand, for the purpose of improving the removability of the unexposed area of the recording layer, means of adding a hydrophilic polymer, for example, polyacrylic acid or polysulfonic acid to the recording layer or providing an undercoat layer containing such a polymer. Thus, developability of the image area increases and it is possible to effectively prevent the occurrence of stain in the unexposed area.

The polymerizable composition of the invention is dissolved in an appropriate solvent selected from various solvents and the resulting solution is coated on a support to form a recording layer.

Examples of the solvent, which can be used, include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol monoethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. The solvents may be used individually or as a mixture of two or more thereof. The solid concentration in the coating solution is suitably from 2 to 50% by weight.

Since the amount of coverage of the recording layer has an influence mainly upon the sensitivity of recording layer, the developability, the strength of the exposed film and the printing durability, it is desirable to appropriately determine the amount of coverage depending on the use. When the amount of coverage is too small, the printing durability may tend to decrease, whereas an excessively large amount of coverage is disadvantageous, because the sensitivity decreases, the exposure takes a time and the development processing also requires a longer period of time. When the lithographic printing plate precursor of the invention is used as a lithographic printing plate precursor for scanning exposure, the amount of coverage of recording layer is suitably from about 0.1 to about 10 $g/m^2$, more preferably from 0.5 to 5 $g/m^2$, in terms of the dry weight.

(Support)

The support for use in the lithographic printing plate precursor of the invention is preferably a support having a hydrophilic surface. For such a purpose, any known hydrophilic support used for a lithographic printing plate precursor can be employed without any limitation.

The support employed is preferably a dimensionally stable plate-like material. Examples thereof include paper, paper laminated with plastic (e.g., polyethylene, polypropylene or polystyrene), a plate of metal (e.g., aluminum, zinc or copper), a film of plastic (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or a plastic film laminated with or having deposited thereon the above-described metal. The surface of the support may be subjected to a known appropriate physical or chemical treatment; if desired, for the purposes, for example, imparting hydrophilicity or increasing strength.

Paper, a polyester film and an aluminum plate are preferably used. Of the supports, the aluminum plate is particularly preferred because it is dimensionally stable, relatively inexpensive and capable of providing a surface excellent in the hydrophilicity and strength by a surface treatment, if desired.

Also, a composite sheet obtained by bonding an aluminum sheet on a polyethylene terephthalate film as described in JP-B-48-18327 is preferably used.

The aluminum plate suitably used includes a pure aluminum plate or an alloy plate mainly comprising aluminum and containing a trace amount of foreign elements. Also, a plastic film laminated with or having deposited thereon aluminum maybe used. Examples of the foreign element contained in the aluminum alloy include silicon, iron, manganese, copper, magnesium, chromium, zinc, bismuth, nickel and titanium. The content of foreign elements in the alloy is at most 10% by weight. In the invention, although pure aluminum is particularly suitably used, it is difficult to produce completely pure aluminum in view of the refining technology. Thus, an aluminum containing a trace amount of foreign elements can be used.

The composition of the aluminum plate for use in the invention is not particularly limited and an aluminum plate conventionally known and used in the field of art can be appropriately utilized. The aluminum plate for use in the invention preferably has a thickness of approximately from 0.1 to 0.6 mm, more preferably from 0.15 to 0.4 mm, and still more preferably from 0.2 to 0.3 mm.

In case of a support having a metal surface, particularly an aluminum surface, the support is preferably subjected to a surface treatment, for example, a surface roughening (graining) treatment, an immersion treatment in an aqueous solution of sodium silicate, potassium fluorozirconate or a phosphate, or an anodic oxidation treatment.

The surface roughening treatment of aluminum plate is performed by various methods, for example, by a method of mechanically roughening the surface, a method of electrochemically dissolving and roughening the surface or a method of chemically dissolving selectively the surface. In the mechanical surface roughening, a known method, for example, ball graining, brush graining, blast graining or buff graining may be used. The electrochemical surface roughening includes a method of transporting an aluminum plate in an electrolytic solution, e.g., hydrochloric acid or nitric acid while applying an alternating current or direct current. Also, a method wherein these two surface roughening treatments may be conducted in combination may be used as described in JP-A-54-63902. Prior to the surface roughening of aluminum plate, the aluminum plate is subjected to a degreasing treatment, for example, with a surface active agent, an organic solvent or an alkaline aqueous solution, if desired, for the purpose of removing rolling oil on the surface thereof.

Further, an aluminum plate subjected to the surface roughening treatment and then to an immersion treatment in an aqueous sodium silicate solution may be preferably used. An aluminum plate subjected to an anodic oxidation treatment and then to an immersion treatment in an aqueous solution of alkali metal silicate as described in JP-B-47-5125 is preferably used. The anodic oxidation treatment is carried out by applying an electric current to the aluminum plate as an anode in an electrolytic solution, for example, in an aqueous or non-aqueous solution of an inorganic acid, e.g., phosphoric acid, chromic acid, sulfuric acid or boric acid, an organic acid, e.g., oxalic acid or sulfamic acid, or a salt thereof. The aqueous or non-aqueous solutions may be used individually or in combination of two or more thereof.

As the hydrophilic treatment of the support surface with the silicic acid compound, silicate electrodeposition as described in U.S. Pat. No. 3,658,662 is also effective. Further, a support subjected to electrolytic graining as described in JP-B-46-27481, JP-A-52-58602 and JP-A-52-30503 and to the above-described anodic oxidation treatment and sodium silicate treatment in combination is useful.

A support subjected to mechanical graining, chemical etching, electrolytic graining, anodic oxidation treatment and sodium silicate treatment in order as described in JP-A-56-28893 is also preferably used.

Further, a support subjected to, after the above-described treatments, an undercoat treatment with a water-soluble resin, for example, polyvinyl phosphonic acid, a polymer or copolymer having a sulfonic acid group in the side chain thereof or polyacrylic acid, a water-soluble metal salt (e.g., zinc borate), a yellow dye or an amine salt is preferably used.

A support subjected to a sol-gel treatment and having covalent-bonded thereto a functional group capable of causing an addition reaction by a radical as described in JP-A-7-159983 is also preferably used.

Other preferred examples include a support obtained by providing a water-resistant hydrophilic layer as a surface layer on a support. Examples of the surface layer include a layer comprising an inorganic pigment and a binder as described in U.S. Pat. No. 3,055,295 and JP-A-56-13168, a hydrophilic swellable layer as described in JP-A-9-80744, and a sol-gel film comprising titanium oxide, polyvinyl alcohol and a silicic acid as described in JP-W-8-507727 (the term "JP-W" as used herein means an "unexamined published international patent application").

The hydrophilic treatment is applied for the purpose of, for example, preventing a detrimental reaction in the polymerizable composition coated thereon or improving the adhesion of the photosensitive layer, in addition to the purpose of rendering the support surface hydrophilic.

(Protective Layer)

In case of using the lithographic printing plate precursor of the invention as a lithographic printing plate precursor for scanning exposure, a protective layer can be provided on the recording layer, if desire. In such a case, the lithographic printing plate precursor is usually exposed in the air, and the protective layer prevents oxygen or a low molecular substance, e.g., a basic substance, present in the air, which inhibits the image formation reaction caused in the recording layer upon exposure, from penetrating into the recording layer and thereby enables the exposure in the air. Accordingly, the protective layer is required to have low permeability to the oxygen or low molecular substance and preferably further has capabilities of not substantially inhibit the transmission of light used for the exposure, exhibiting excellent adhesion to the recording layer and being easily removed in a development step after the exposure.

Investigations on the protective layer have been made as described in detail in U.S. Pat. No. 3,458,311 and JP-A-55-49729. Examples of the material which can be used in the protective layer include a water-soluble polymer compound having relatively good crystallinity. Specific examples thereof include a water-soluble polymer, for example, polyvinyl alcohol, polyvinyl pyrrolidone, acidic cellulose, gelatin, gum arabic or polyacrylic acid. Particularly, polyvinyl alcohol is preferably used as the main component because most advantageous results in the fundamental properties such as oxygen inhibiting property and development removability can be obtained. The polyvinyl alcohol for use in the protective layer has necessary oxygen inhibiting property and water solubility, therefore, as long as it contains an unsubstituted vinyl alcohol unit, a part may be displaced with an ester, an ether or an acetal. Similarly, a part may have another copolymer component. In particular, a compound wherein polyvinyl alcohol is substitute with polyvinyl pyrrolidone in a range of from 15 to 50% by weight is preferred in view of preservation stability.

Specific examples of the polyvinyl alcohol which can be used include those having a hydrolysis ratio of from 71 to 100 mol% and a weight average molecular weight of from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

The components of the protective layer (e.g., selection of PVA or use of additives) and the coating amount thereof are determined by taking account of fogging property, adhesive property and scratch resistance, in addition to the oxygen inhibiting property and the development removability. In general, PVA having a higher hydrolysis ratio (namely, the protective layer has a higher unsubstituted vinyl alcohol unit content) and the layer thickness is larger, the oxygen inhibiting property becomes stronger and this is more advantageous in view of sensitivity. However, if the oxygen inhibiting property is extremely increased, the undesirable polymerization reaction may be caused during the production or preservation, or the undesirable fog or thickening of image line may be generated at the image exposure. Further, the adhesive property to the image area and the scratch resistance are also very important in view of handling of the plate. Specifically, when a hydrophilic layer comprising a water-soluble polymer is coated on a lipophilic polymer layer, the layer is readily peeled off due to insufficient adhesion.

To overcome such a problem, various proposals have been made to improve the adhesive property between those two layers. For example, in U.S. Pat. Nos. 292,501 and 44,563, there are described techniques of mixing from 20 to 60% by weight of an acrylic emulsion or a water-insoluble vinyl pyrrolidone-vinyl acetate copolymer in a hydrophilic polymer mainly comprising polyvinyl alcohol and applying the mixture to the lipophilic polymer layer, thereby obtaining a sufficiently high adhesive property. These known techniques can be applied to the protective layer for use in the invention. A coating method of the protective layer is described in detail, for example, in U.S. Pat. No. 3,458,311 and JP-A-55-49729.

Further, other functions may be imparted to the protective layer. For instance, the addition of a coloring agent (e.g., water-soluble dye), which has excellent transmittance of light for exposure (for example, infrared laser having a wavelength of from 760 to 1,200 nm) and effectively absorbs light having a wavelength irrelevant to the exposure can improve the safelight aptitude without causing any reduction in the sensitivity.

Furthermore, other functions may be imparted to the protective layer. For instance, when a laser ray is used as the light source, the photosensitive composition is intended to exhibit excellent sensitivity to light at the wavelength of the light source but not sensitive to light at other wavelengths. In a case where the light source emits light in an infrared region of 750 nm or more, the printing plate precursor may be used substantially in a bright room. In some cases, however, the printing plate precursor is also practically sensitive to light having a short wavelength, e.g., light of a fluorescent lamp. In such a case, a coloring agent (e.g., water-soluble dye) ensuring excellent transmittance of light of the light source and capable of efficiently absorbing light at a wavelength of less than 700 nm is preferably added. In another example where a light source which emits light in the ultraviolet region of 450 nm or less is used, the printing plate precursor can be substantially used under a safelight. However, in some cases, the printing plate precursor is also sensitive to visible light of 500 nm or more. In such a case, a coloring agent (e.g., water-soluble dye) ensuring excellent transmission of light of the light source and capable of efficient absorbing light at a wavelength of 500 nm or more may be used, whereby the safelight aptitude can be more improved without causing any reduction in the sensitivity.

With respect to the exposure method of the lithographic printing plate precursor according to the invention, known methods may be used without any limitation. The light source used is preferably a laser. Examples of the laser light source having a wavelength of from 350 to 450 nm available at present, which can be used, include the followings:

Gas laser, for example, Ar ion laser (364 nm, 351 nm, from 10 mW to 1 W), Kr ion laser (356 nm, 351 nm, from 10 mW to 1 W) or He—Cd laser (441 nm, 325 nm, from 1 to 100 mW);

Solid laser, for example, a combination of Nd:YAG ($YVO_4$) with SHG crystal×twice (355 nm, from 5 mW to 1 W) or a combination of Cr:LiSAF with SHG crystal (430 mn, 10 mW);

Semiconductor laser, for example, $KNbO_3$, ring resonator (430 nm, 30 mW), a combination of a waveguide type wavelength conversion element with AlGaAs or InGaAs semiconductor (from 380 to 450 nm, from 5 to 100 mW), a combination of a waveguide type wavelength conversion element with AlGaInP or AlGaAs semiconductor (from 300 to 350 nm, from 5 to 100 mW), or AlGaInN (from 350 to 450 nm, from 5 to 30 mW); and Pulse laser, for example, $N_2$ laser (337 nm, pulse; from 0.1 to 10 mJ) or XeF (351 nm, pulse: from 10 to 250 mJ).

Of these lasers, the AlGaInN semiconductor laser (commercially available InGaN-type semiconductor laser: from 400 to 410 nm, from 5 to 30 mW) is preferred in view of the wavelength property and the cost.

In addition, as the available light source which emits light of from 450 to 700 nm, Ar+ laser (488 nm), YAG-SHG laser (532 nm), He—Ne laser (633 nm), He—Cd laser and red semiconductor laser (from 650 to 690 nm) may be suitably used, and as the available light source which emits light of from 700 to 1,200 nm, semiconductor laser (from 800 to 850 nm) and Nd-YAG laser (1,064 nm) may be suitably used.

Furthermore, various mercury lamps of ultra high pressure, high pressure, medium pressure and low pressure, a chemical lamp, a carbon arc lamp, a xenon lamp, a metal halide lamp, an ultraviolet laser lamp (e.g., ArF excimer laser or KrF excimer laser) and a radiation, for example, an electron beam, an X ray, an ion beam or a far infrared ray may be used.

Among them, the light source for light for use in the image exposure of the lithographic printing plate precursor according to the invention is preferably a light source having an emission wavelength in a region of from near infrared to infrared and particularly preferably a solid laser or a semiconductor laser.

The exposure mechanism may be any of an internal surface drum system, an external surface drum system and a flat bed system. The components of the recording layer for use in the invention may have high water solubility and thereby the recording layer may be rendered to be soluble in neutral water or alkalescent water. A lithographic printing plate precursor having such a recording layer can be subjected to a so-called on-machine development system wherein the lithographic printing plate precursor is mounted on a printing machine and performed exposure and development processing on the machine, without any development processing using liquid bath.

The lithographic printing plate precursor according to the invention is usually subjected to imagewise exposure and then developed with a developer to remove the unexposed area thereof, thereby forming an image. The developer, which is preferably used, includes a developer as described in JP-B-57-7427. An aqueous solution of an inorganic alkali agent, e.g., sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia, or an aqueous solution of an organic alkali agent, e.g., monoethanolamine or diethanolamine is suitably used. The alkali agent is added so that a concentration of the alkali agent in the solution is ordinarily from 0.1 to 10% by weight, preferably from 0.5 to 5% by weight.

The aqueous alkaline solution may contain, if desired, a small amount of a surface active agent or an organic solvent, for example, benzyl alcohol, 2-phenoxyethanol or 2-butoxyethanol. Examples of such aqueous alkaline solution include those described in U.S. Pat. Nos. 3,375,171 and 3,615,480.

Further, developing solutions as described in JP-A-50-26601, JP-A-58-54341, JP-B-56-39464 and JP-B-56-42860 are also excellent.

Moreover, using as the developing solution, a developing solution containing a specific aromatic nonionic surface active agent as described in JP-A-2002-202616 is preferable for the lithographic printing plate precursor using the polymerizable composition mainly comprising the polymer according to the invention.

A printing plate obtained by development processing using the developing solution and replenisher is subjected to after treatment with washing water, a rinse solution containing a surface active agent or a desensitizing solution containing gum Arabic or a starch derivative. As the after treatment for the lithographic printing plate according to the invention, these treatments may also be used in combination.

In the plate-making process of lithographic printing plate precursor according to the invention, the entire surface of lithographic printing plate precursor may be heated, if desired, before or during the exposure or in the period from the exposure to the development. By the heating, the image-forming reaction in the recording layer is accelerated, and advantageous effects, for example, improvement in the sensitivity and the printing durability or stabilization of the sensitivity can be obtained. Furthermore, for the purpose of improving the image strength and the printing durability, it is also effective to conduct after-heating or exposure to the entire surface of the image after the development. It is preferred that the heating before the exposure is conducted under a mild condition as a temperature of 150° C. or below. If the temperature is excessively high, a problem, for example, the formation of fog in the non-image area may arise. In the heating after the development, a very severe condition as a temperature of from 200 to 500° C. is usually used. In such a temperature range, a sufficient effect of strengthening the image occurs, and a problem, for example, deterioration of the support or thermal decomposition of the image area does not arise. In a scanning exposure of the lithographic printing plate precursor according to the invention, known methods may be used without any limitation.

The polymerizable composition of the invention is particularly suitably used as the recording layer of lithographic printing plate precursor for scanning exposure as described above. However, it is also suitable for e high-sensitive photomolding materials, and can be employed as hologram materials utilizing change in a refractive index resulting from polymerization and electronic materials, for example, photoresist.

The present invention will be described in greater detail with reference to the following examples, but the invention should not be construed as being limited thereto.

[Synthesis of Polymerizable Alkali-soluble Resin (A)]

Synthesis Example 1

Synthesis of Polymerizable Alkali-soluble Resin (A-1)

In a 1,000 ml three-necked flask equipped with a condenser and a stirrer was put 30 ml of N,N-dimethylacetamide, followed by heating to 70° C. Under nitrogen gas stream, 300 ml of N,N-dimethylacetamide solution containing M-1 shown below (0.5 mol), methyl methacrylate (0.3 mol), methacrylic acid (0.2 mol) and 2'-azobis(2-methylbutyronitrile) (manufactured by Wako Pure Chemical Industries, Ltd.) (0.001 mol) was dropwise added over a period of 2.5 hours, followed by subjecting to reaction at 70° C. for 2 hours.

The reaction solution was diluted with 300 ml of N,N-dimethylacetamide, cooled to a room temperature and 4-hydroxy-2,2,6,6-tetramethylpiperidin-1-oxyl (free radical) (0.2 g) and tert-butanol (5 g) were added thereto. Then, 1,8-Diazabicyclo[5.4.0]-7-undecene (0.8 mol) was dropwise added to the reaction solution at 0° C. over a period of 2 hours, followed by stirring at a room temperature for 24 hours. The reaction solution was then acidified with hydrochloric acid at 0° C., followed by stirring at 0° C. for 30 minutes. The solution was poured into water (5 liters) with vigorous stilling, followed by stirring for one hour. The white solid thus deposited was collected by filtration and dried to obtain Polymerizable alkali-soluble resin (A-1) according to the invention.

Resin (A-1) obtained was subjected to measurement by a gel permeation chromatography method to find a weigh average molecular weight of 131,000 calculated in terms polystyrene. The identification was conducted by NMR and IR spectra.

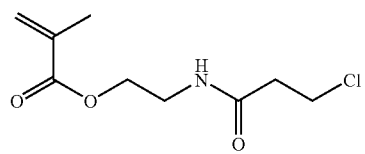

(M-1)

Synthesis Example 2

Synthesis of Polymerizable Alkali-soluble Resin (A-23)

In a 1,000 ml three-necked flask equipped with a condenser and a stirrer was put 30 ml of N,N-dimethylacetamide, followed by heating to 70° C. Under nitrogen gas stream, 300 ml of N,N-dimethylacetamide solution containing M-2 shown below (0.5 mol), phenyl methacrylate (0.3 mol), methacrylic acid (0.2 mol) and 2'-azobis(2-methylbutyronitrile) (manufactured by Wako Pure Chemical Industries, Ltd.) (0.001 mol) was dropwise added over a period of 2.5 hours, followed by subjecting to reaction at 70° C. for 2 hours. The solution was poured into water (5 liters) with vigorous stilling, followed by stirring for one hour. The white solid thus deposited was collected by filtration and dried to obtain Polymerizable alkali-soluble resin (A-23) according to the invention.

Resin (A-23) obtained was subjected to measurement by a gel permeation chromatography method to find a weigh average molecular weight of 106,000 calculated in terms polystyrene. The identification was conducted by NMR and IR spectra.

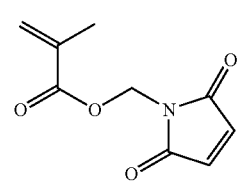

(M-2)

Synthesis Example 3

Synthesis of Polymerizable Alkali-soluble Resin (A-30)

In a 1,000 ml three-necked flask equipped with a condenser and a stirrer was put 30 ml of N,N-dimethylacetamide, followed by heating to 70° C. Under nitrogen gas stream, 300 ml of N,N-dimethylacetamide solution containing hydroxyethyl methacrylate (0.5 mol), methyl methacrylate (0.2 mol), methacrylic acid (0.3 mol) and 2'-azobis(2-methylbutyronitrile) (manufactured by Wako Pure Chemical Industries, Ltd.) (0.001 mol) was dropwise added over a period of 2.5 hours, followed by subjecting to reaction at 70° C. for 2 hours. The reaction solution was cooled to 0° C., crotonic chloride (0.55 mol) was dropwise added thereto with stirring, and the solution was subjected to reaction for 12 hours while gradually raising temperature of the solution to a room temperature. The solution was poured into water (5 liters) with vigorous stilling, followed by stirring for one hour. The white solid thus deposited was collected by filtration and dried to obtain Polymerizable alkali-soluble resin (A-30) according to the invention.

Resin (A-30) obtained was subjected to measurement by a gel permeation chromatography method to find a weigh average molecular weight of 119,000 calculated in terms polystyrene. The identification was conducted by NMR and IR spectra.

In a similar manner to above, Polymerizable alkali-soluble resins (A-2) to (A-22), (A-24) to (A-29) and (A-31) to (A-37) were obtained.

EXAMPLES 1 TO 10 AND COMPARATIVE EXAMPLES 1 to 10

(Preparation of Support)

A 0.3 mm-thick aluminum plate was etched by dipping it in a 10% by weight aqueous sodium hydroxide solution at 60° C. for 25 seconds, washed with running water, neutralized and cleaned with a 20% by weight aqueous nitric acid solution and then washed with water. The aluminum plate was then subjected to an electrolytic graining treatment in a 1% by weight aqueous nitric acid solution using an alternating current with a sinusoidal waveform at electricity of 300 coulomb/dm$^2$ during the anodic time. Subsequently, the aluminum plate was dipped in a 1% by weight aqueous sodium hydroxide solution at 40° C. for 5 seconds, dipped in a 30% by weight aqueous sulfuric acid solution at 60° C. for 40 seconds to conduct a desmut treatment, and then subjected to an anodic oxidation treatment in a 20% by weight aqueous sulfuric acid solution for 2 minutes at a current density of 2 A/dm$^2$ to form an anodic oxide film having a thickness of 2.7 g/m$^2$. The surface roughness measured was 0.3 μm (the Ra value according to JIS B0601).

On the back surface of the thus-treated aluminum plate, a coating solution for backcoat layer described below was coated by a bar coater and dried at 100° C. for 1 minute, thereby preparing a support having provided thereon the backcoat layer having a dry coating amount of 70 mg/m$^2$.

| Sol-gel reaction solution | |
|---|---|
| Tetraethyl silicate | 50 parts by weight |
| Water | 20 parts by weight |
| Methanol | 15 parts by weight |
| Phosphoric acid | 0.05 parts by weight |

The above components were mixed and stirred, and about 5 minutes later, heat generation occurred. After reacting the mixture for 60 minutes, a solution having the composition shown below was added the reaction mixture to prepare the coating solution for backcoat layer.

| | |
|---|---|
| Pyrogallol formaldehyde condensation resin (molecular weight: 2,000) | 4 parts by weight |
| Dimethyl phthalate | 5 parts by weight |
| Fluorine-based surface active agent (N-butylperfluorooctane sulfonamidoethyl acrylate/ polyoxyethylene acrylate copolymer, molecular weight: 20,000) | 0.7 parts by weight |
| Methanol silica sol (manufactured by Nissan Chemical Industries, Ltd., 30% by weight in methanol) | 50 parts by weight |
| Methanol | 800 parts by weight |

(Preparation of Recording Layer)

On the above-described aluminum support provided with the backcoat layer, a polymerizable composition (coating solution for recording layer) having the composition shown below was coated and dried at 100° C. for 1 minute to form a recording layer having a dry coating amount of 1.5 g/m$^2$.

| <Coating solution for recording layer> | |
|---|---|
| Polymerizable compound (B) shown in Tables 2 to 4 | 2.0 g |
| Binder polymer (Polymerizable alkali-soluble resin (A)) shown in Table 2 to 4 | 2.0 g |
| Sensitizing dye (D) shown in Table 2 to 4 | 0.08 g |
| Polymerization initiator (C) shown in Table 2 to 4 | 0.3 g |
| Fluorine-based nonionic surface active agent (Megafac F-176, manufactured by Dainippon Ink & Chemicals, Inc.) | 0.01 g |
| Naphthalene sulfonate of Victoria Pure Blue | 0.04 g |
| Methyl ethyl ketone | 9.0 g |
| Propylene glycol monomethyl ether | 8.0 g |
| Methanol | 10.0 g |

TABLE 2

| | Polymerizable Alkali-Soluble Resin (A) | Polymerizable Compound (B) | Initiator (C) | Sensitizing Dye (D) | Protective Layer | Reactivity Ratio r1 | Reactivity Ratio r2 | Relative Sensitivity* | Image Quality-Printing Durability | Preservation Stability |
|---|---|---|---|---|---|---|---|---|---|---|
| Example 1 | A-1 | B-3 | C-1 | D-1 | Present | 3.0 | 0.53 | 1 | 100 | 1.05 |
| Comparative Example 1 | A-31 | B-10 | C-1 | D-1 | Present | 0.49 | 1.65 | 0.6 | 60 | 1.05 |
| Example 2 | A-5 | B-4 | C-2 | D-2 | Present | 4.2 | 0.12 | 1.4 | 150 | 1.05 |
| Comparative Example 2 | A-33 | B-11 | C-2 | D-2 | Present | 0.12 | 4.2 | 0.5 | 70 | 1.05 |
| Example 3 | A-2 | B-4 | C-2 | D-2 | Present | 1.2 | 0.26 | 1.2 | 120 | 1.1 |
| Comparative Example 3 | A-2 | B-11 | C-2 | D-2 | Present | 4.72 | 0.11 | 0.6 | 60 | 1.1 |

TABLE 3

| | Polymerizable Alkali-Soluble Resin (A) | Polymerizable Compound (B) | Initiator (C) | Sensitizing Dye (D) | Protective Layer | Reactivity Ratio r1 | Reactivity Ratio r2 | Relative Sensitivity* | Image Quality-Printing Durability | Preservation Stability |
|---|---|---|---|---|---|---|---|---|---|---|
| Example 4 | A-4 | B-3 | C-1 | D-3 | Present | 1.65 | 0.49 | 1 | 100 | 1.05 |
| Comparative Example 4 | A-34 | B-10 | C-1 | D-3 | Present | 0.49 | 1.65 | 0.7 | 80 | 1.05 |

TABLE 3-continued

| | Polymerizable Alkali-Soluble Resin (A) | Polymerizable Compound (B) | Initiator (C) | Sensitizing Dye (D) | Protective Layer | Reactivity Ratio r1 | Reactivity Ratio r2 | Relative Sensitivity* | Image Quality-Printing Durability | Preservation Stability |
|---|---|---|---|---|---|---|---|---|---|---|
| Example 5 | A-29 | B-6 | C-1 | D-3 | Present | 2.52 | 0.05 | 1 | 100 | 1.05 |
| Comparative Example 5 | A-35 | B-13 | C-1 | D-3 | Present | 0.05 | 2.52 | 0.6 | 60 | 1.1 |
| Example 6 | A-23 | B-6 | C-2 | D-4 | Present | 2.58 | 0.17 | 1.2 | 120 | 1.05 |
| Comparative Example 6 | A-34 | B-12 | C-2 | D-4 | Present | 0.17 | 2.58 | 0.6 | 70 | 1.05 |

TABLE 4

| | Polymerizable Alkali-Soluble Resin (A) | Polymerizable Compound (B) | Initiator (C) | Sensitizing Dye (D) | Protective Layer | Reactivity Ratio r1 | Reactivity Ratio r2 | Relative Sensitivity* | Image Quality-Printing Durability | Preservation Stability |
|---|---|---|---|---|---|---|---|---|---|---|
| Example 7 | A-1 | B-1 | C-3 | D-5 | Present | 1.2 | 0.26 | 1 | 100 | 1.05 |
| Comparative Example 7 | A-31 | B-10 | C-3 | D-5 | Present | 0.49 | 1.65 | 0.5 | 60 | 1.05 |
| Example 8 | A-7 | 8.3 | C-4 | D-6 | Present | 3.58 | 0.13 | 1.4 | 150 | 1.05 |
| Comparative Example 8 | A-37 | B-11 | C-4 | D-6 | Present | 0.13 | 3.58 | 0.6 | 60 | 1.05 |
| Example 9 | A-4 | B-3 | C-3 | D-5 | Absent | 1.65 | 0.49 | 1.1 | 120 | 1.05 |
| Comparative Example 9 | A-34 | B-10 | C-3 | D-5 | Absent | 0.49 | 1.65 | 0.6 | 70 | 1.1 |
| Example 10 | A-26 | B-9 | C-4 | D-6 | Absent | 1.23 | 0 | 1.3 | 140 | 1.05 |
| Comparative Example 10 | A-36 | B-14 | C-4 | D-6 | Absent | 0 | 1.23 | 0.6 | 60 | 1.05 |

(Preparation of Protective Layer)

With respect to Examples 1 to 8 and Comparative Examples 1 to 8, a 3% by weight aqueous solution of polyvinyl alcohol (saponification degree: 98% by mole, polymerization degree: 550) was coated on the recording layer and dried at 100° C. for 2 minutes to prepare a protective layer having a dry coating amount of 2 g/m². Specifically, the lithographic printing plate precursors of Examples 1 to 3 and Comparative Examples 1 to 3 for recording with a wavelength of 400 nm, those of Examples 4 to 6 and Comparative Examples 4 to 6 for recording with a wavelength of 532 nm, and those of Examples 7 to 8 and Comparative Examples 7 to 8 for recording with a wavelength of 830 nm each had the protective layer.

Thus, the lithographic printing plate precursors of Examples 1 to 10 and Comparative Examples 1 to 10 were prepared.

The structures of Polymerization initiators (C-1) to (C-4) and Sensitizing dyes (D-1) to (D-6) described in Tables 2 to 4 are shown below. In Tables 2 to 4, Polymerizable alkali-soluble resins (A-1) to (A-37) and Polymerizable compounds (B-1) to (B-14) are the compounds illustrated as the specific examples hereinbefore.

CGI-784 (manufactured by Ciba Geigy AG) C-1

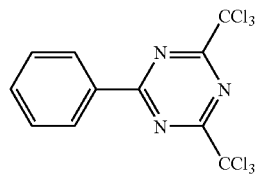

C-2

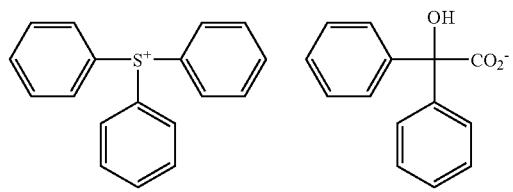

C-3

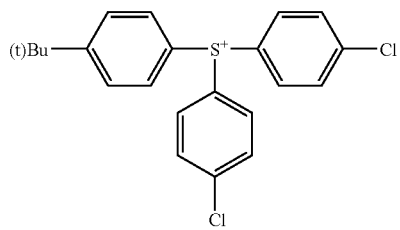

C-4

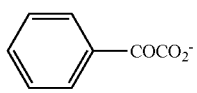

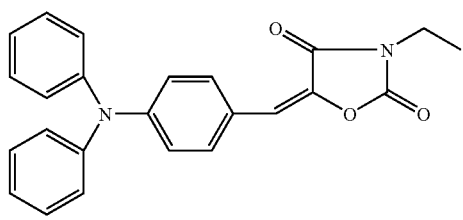

D-1

-continued

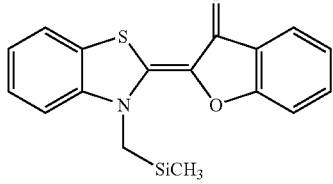
D-2

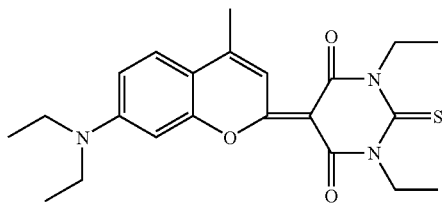
D-3

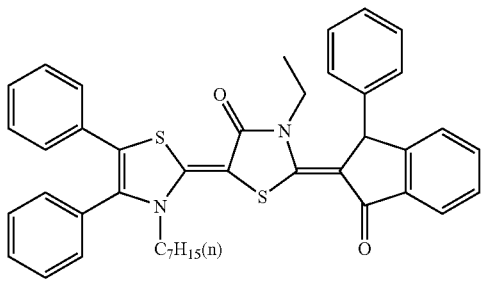
D-4

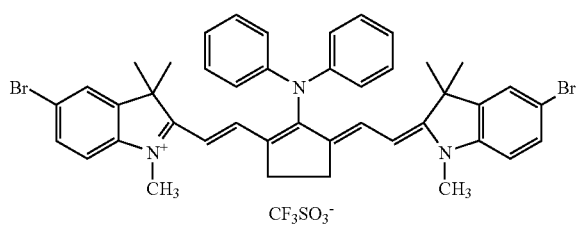
D-5

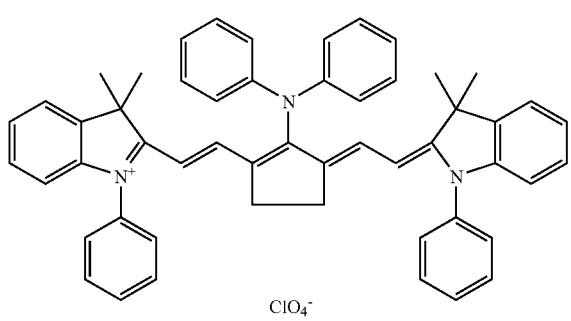
D-6

(Exposure of Lithographic Printing Plate Precursor)

The lithographic printing plate precursors obtained above were subjected to scanning exposure using laser corresponding to each of the lithographic printing plate precursors. The details of exposure conditions are described below.

(1) Lithographic Printing Plate Precursors of Examples 1 to 3 and Comparative Examples 1 to 3

The lithographic printing plate precursor was subjected to scanning exposure using InGaN semiconductor laser having an oscillation wavelength of 400 nm under conditions to provide a beam diameter of 25 μm and an exposure energy density of 0.15 mJ/cm² on the plate surface.

(2) Lithographic Printing Plate Precursors of Examples 4 to 6 and Comparative Examples 4 to 6

The lithographic printing plate precursor was exposed using FD-YAG (532 nm) laser exposure apparatus (plate setter: Gutenberg manufactured by Heidelberg) under conditions to provide an exposure energy density on the plate surface of 200 μJ/cm².

(3) Lithographic Printing Plate Precursors of Examples 7 to 10 and Comparative Examples 7 to 10

The lithographic printing plate precursor was exposed using Trendsetter 3244VFS loaded with 40 W water-cooling infrared semiconductor laser (830 nm) under conditions of output of 9 W, external surface drum rotation number of 210 rpm, plate surface energy of 100 mJ/cm² and resolution of 2,400 dpi.

(Development/Plate-making)

After the exposure, the lithographic printing plate precursor was subjected to development/plate-making at 30° C. using an automatic developing machine (Stablon 900N manufactured by Fuji Photo Film Co., Ltd.) loaded a developing solution described below and a solution obtained by 1:1 dilution of finisher (FN-6 manufactured by Fuji Photo Film Co., Ltd.) with water to prepare a lithographic printing plate.

| <Developing solution> | |
|---|---|
| Water | 800 g |
| DV-2 (manufactured by Fuji Photo Film Co., Ltd.) | 200 g |

[Evaluation]

The printing plate obtained was evaluated according to the following methods. The results are shown in Tables 2 to 4.

1. Evaluation of Image Quality-printing Durability

The lithographic printing plate precursor was subjected to scanning exposure using laser corresponding the polymerizable composition used therein to form 0.5% halftone dots (highlight) and developed with the developing solution described above.

The lithographic printing plate having the image formed was subjected to printing using a printing machine Heider KOR-D, and a number of good prints obtained until the termination of printing was relatively compared as the index of printing durability.

According to the exposure wavelength, Examples 1, 4 and 7 were taken as the standard (100) in the respective exposure systems. The larger the index, the better the printing durability. The large number of this value indicates good printing durability in highly precise highlight area. The number is the index for evaluating the compatibility of image quality and printing durability wherein substantially high image quality and excellent printing durability of the high image quality portion are obtained.

2. Evaluation of Sensitivity

The lithographic printing plate precursor was subjected to scanning exposure using laser corresponding the polymerizable composition used therein. Then the lithographic printing plate precursor was subjected to development by immersing in a developing solution having the composition described above at 25° C. for 10 seconds. From the minimum exposure amount necessary for forming an image, the sensitivity under each exposure condition was calculated in a unit of mJ/cm². The value was relatively compared as the index of the sensitivity. Specifically, depending on the exposure wavelength, Examples 1, 4 and 7 were taken as the standard (1.0) in the respective exposure systems. The relative sensitivity is defined as follows:

Relative sensitivity=(sensitivity of standard material/ sensitivity of subject material)

The relative sensitivity is evaluated so that the larger the value, better the sensitivity.

3. Evaluation of Preservation Stability

The lithographic printing plate precursor was allowed to stand under a high temperature condition (60° C.) for 3 days and then immersed in the developing solution described above to determine time necessary for removing the recording layer by the development. On the other hand, the lithographic printing plate precursor just after the production (without storage under the high temperature condition) was also subjected to the same test. A ratio of time for the completion of development of the lithographic printing plate precursor between before and after the preservation at high temperature was obtained. The time ratio of not more than 1.1 is preferable in the production and denotes excellent preservation stability.

The results of the evaluations obtained are also shown in Tables 2 to 4 above.

Form the results shown in Tables 2 to 4, it can be understood that the lithographic printing plate precursors of the examples using the polymerizable compositions as the recording layer according to the invention are capable of recoding at high sensitivity, achieve both high image quality and excellent printing durability, and exhibit good preservation stability. On the contrary, the lithographic printing plate precursors of the comparative examples wherein the relative reaction speed of the polymerizable groups included in respective compounds are out of the range of the invention are inferior to the lithographic printing plate precursors of the examples in the relative sensitivity, image quality-printing durability, even when the polymerizable alkali-soluble resin (A) and the polymerizable compound (B) were used.

According to the present invention, a polymerizable composition, in which a curing reaction precedes at high sensitivity, which provides a curing film having excellent hardness and exhibits good preservation stability, can be provided. Also, a lithographic printing plate precursor having a recording layer containing the polymerizable composition is capable of recording at high sensitivity with infrared laser exposure and exhibits excellent printing durability and good preservation stability. Although it is difficult to satisfy both sensitivity and heat stability in case of the infrared laser exposure, the radical polymerizable composition of the invention is advantageously used.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A radical polymerizable composition comprising (A) an alkali-soluble resin containing a radical polymerizable group, (B) a radical polymerizable compound, and (C) a radical initiator, wherein the crosslinking reactivity of a polymerizable group of the polymerizable compound (B) to a polymerizable group of the polymerizable compound (B) is larger than the crosslinking reactivity of a polymerizable group of the polymerizable compound (B) to a radical polymerizable group of the alkali-soluble resin (A), and the crosslinking reactivity of a radical polymerizable group of the alkali-soluble resin (A) to a polymerizable group of the polymerizable compound (B) is larger than the crosslinking reactivity of a radical polymerizable group of the alkali-soluble resin (A) to a radical polymerizable group of the alkali-soluble resin (A), and wherein the combination of polymerizable group (B)/polymerizable group (A) in radical polymerizable compound (B)/polymerizable alkali-soluble resin (A) is selected from the group consisting of acrylate/crotonate, methacrylate/crotonate, and methacrylate/itaconate.

2. The radical polymerizable composition as claimed in claim 1, which further comprises (D) a sensitizing dye.

3. The radical polymerizable composition as claimed in claim 2, wherein the sensitizing dye (D) is an infrared absorbing agent having an absorption in a wavelength range of from 700 to 1,200 nm.

4. The radical polymerizable composition as claimed in claim 2, wherein the sensitizing dye (D) is a sensitizing dye having an absorption in a wavelength range of from 350 to 700 nm.

5. The radical polymerizable composition as claimed in claim 1, wherein the radical initiator is an onium salt compound or a compound having a carbon-halogen bond.

6. The radical polymerizable composition as claimed in claim 1, wherein the combination of polymerizable group (B)/polymerizable group (A) in radical polymerizable compound (B)/polymerizable alkali-soluble resin (A) is selected from the group consisting of acrylate/crotonate and methacrylate/crotonate.

7. An image-forming method comprising irradiating the radical polymerizable composition as claimed in claim 1 with a semiconductor laser having a wavelength of from 350 to 1,200 nm.

8. A lithographic printing plate precursor comprising a support having thereon a recording layer comprising a radical polymerizable composition comprising (A) an alkali-soluble resin containing a radical polymerizable group, (B) a polymerizable compound, and (C) a radical initiator, wherein the crosslinking reactivity of a polymerizable group of the polymerizable compound (B) to a polymerizable group of the polymerizable compound (B) is larger than the crosslinking reactivity of a polymerizable group of the polymerizable compound (B) to a radical polymerizable group of the alkali-soluble resin (A), and the crosslinking reactivity of a radical polymerizable group of the alkali-soluble resin (A) to a polymerizable group of the polymerizable compound (B) is larger than the crosslinking reactivity of a radical polymerizable group of the alkali-soluble resin (A) to a radical polymerizable group of the alkali-soluble resin (A), and wherein the combination of polymerizable group (B)/polymerizable group (A) in radical polymerizable compound (B)/polymerizable alkali-soluble resin (A) is selected from the group consisting of acrylate/crotonate, methacrylate/crotonate, and methacrylate/itaconate.

* * * * *